United States Patent
Eimori et al.

(10) Patent No.: US 8,288,221 B2
(45) Date of Patent: Oct. 16, 2012

(54) METHOD OF MANUFACTURING SEMICONDUCTOR DEVICE AND SEMICONDUCTOR DEVICE

(75) Inventors: Takahisa Eimori, Tokyo (JP); Nobuyuki Mise, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 455 days.

(21) Appl. No.: 12/537,875

(22) Filed: Aug. 7, 2009

(65) Prior Publication Data

US 2010/0038729 A1    Feb. 18, 2010

(30) Foreign Application Priority Data

Aug. 13, 2008  (JP) .................................. 2008-208472

(51) Int. Cl.
*H01L 21/8238*  (2006.01)

(52) U.S. Cl. .................. 438/216; 257/411; 257/E21.19; 257/E29.255

(58) Field of Classification Search .................. 257/411, 257/E21.19, E29.255; 438/216, 261, 287, 438/591
See application file for complete search history.

(56) References Cited

U.S. PATENT DOCUMENTS

| | | | |
|---|---|---|---|
| 6,897,095 B1 | 5/2005 | Adetutu et al. | |
| 7,060,568 B2 | 6/2006 | Metz et al. | |
| 7,087,476 B2 | 8/2006 | Metz et al. | |
| 2002/0135030 A1 | 9/2002 | Horikawa | |
| 2006/0001106 A1 | 1/2006 | Metz et al. | |
| 2006/0022271 A1 | 2/2006 | Metz et al. | |
| 2006/0180870 A1 | 8/2006 | Ichihara et al. | |
| 2006/0214237 A1 | 9/2006 | Metz et al. | |
| 2007/0210354 A1 | 9/2007 | Nabatame et al. | |
| 2007/0296043 A1 | 12/2007 | Ichihara et al. | |
| 2007/0298560 A1 | 12/2007 | Ichihara et al. | |
| 2008/0308865 A1* | 12/2008 | Wang et al. | .................. 257/345 |
| 2010/0258878 A1 | 10/2010 | Mise et al. | |

FOREIGN PATENT DOCUMENTS

| | | |
|---|---|---|
| JP | 2002-280461 A | 9/2002 |
| JP | 2006-024594 A | 1/2006 |
| JP | 2006-222385 A | 8/2006 |
| JP | 2007-080913 A | 3/2007 |

(Continued)

OTHER PUBLICATIONS

H.N. Alshareef et al, "Thermally Stable N-Metal Gate MOSFETs Using La-Incorporated HfSiO Dielectric", 2006 Symposium on VLSI Technology Digest of Technical Papers, pp. 10, 2006.

Hyung-Suk Jung et al, "Dual High-k Gate Dielectric Technology Using Selective $AIO_x$ Etch (SAE) Process with Nitrogen and Fluorine Incorporation", 2006 Symposium on VLSI Technology Digest of Technical Papers, pp. 204, 2006.

(Continued)

*Primary Examiner* — Julio J Maldonado
*Assistant Examiner* — Sonya McCall Shepard
(74) *Attorney, Agent, or Firm* — Miles & Stockbridge P.C.

(57) ABSTRACT

A base insulating film containing hafnium and oxygen is formed on a silicon oxide ($SiO_2$) film formed on a main surface of a substrate. Subsequently, a metal thin film thinner than the base insulating film and made of only a metal element is formed on the base insulating film, and a protective film having humidity resistance and oxidation resistance is formed on the metal thin film. Then, by diffusing the entire metal element of the metal thin film into the base insulating film in a state of having the protective film, a mixed film (high dielectric constant film) thicker than the silicon oxide film and having a higher dielectric constant than silicon oxide and containing hafnium and oxygen of the base insulating film and the metal element of the metal thin film is formed on the silicon oxide film.

6 Claims, 20 Drawing Sheets

FOREIGN PATENT DOCUMENTS

| | | |
|---|---|---|
| JP | 2007-243009 A | 9/2007 |
| WO | WO 2005/114718 A1 | 12/2005 |
| WO | WO 2006/012311 A1 | 2/2006 |
| WO | WO 2006/028577 A2 | 3/2006 |
| WO | WO 2009/072421 A1 | 6/2009 |

OTHER PUBLICATIONS

T. Schram et al, "Novel Process to Pattern Selectively Dual Dielectric Capping Layers Using Soft-Mask Only", 2008 Symposium on VLSI Technology Digest of Technical Papers, pp. 44, 2008.

* cited by examiner

FIG. 5

| METAL OXIDE | ELECTRONEGATIVITY |
|---|---|
| MgO | 2.11 |
| $La_2O_3$ | 2.18 |
| $Gd_2O_2$ | 2.26 |
| $Y_2O_3$ | 2.27 |
| $HfO_2$ | 2.49 |
| $Al_2O_3$ | 2.54 |
| $TiO_2$ | 2.63 |
| $Ta_2O_5$ | 2.71 |

ANNEALING PROCESS

ANNEALING PROCESS

METHOD OF MANUFACTURING SEMICONDUCTOR DEVICE AND SEMICONDUCTOR DEVICE

CROSS-REFERENCE TO RELATED APPLICATION

The present application claims priority from Japanese Patent Application No. JP 2008-208472 filed on Aug. 13, 2008, the content of which is hereby incorporated by reference into this application.

TECHNICAL FIELD OF THE INVENTION

The present invention relates to a semiconductor device and its manufacturing technique, and in particular, it relates to a technique effectively applied to a semiconductor device provided with an n-channel type MISFET (Metal Insulator Semiconductor Field Effect Transistor) and a p-channel type MISFET.

BACKGROUND OF THE INVENTION

As one of the means for improving transistor drivability such as the increase of on-state current while miniaturizing and integrating a MISFET (hereinafter, referred to as MIS transistor) which constitutes a semiconductor integrated circuit, a gate insulating film is made thinner. However, in the case where the gate insulating film is formed of only silicon oxide which has been conventionally used, an excessive thinness of the film thickness makes the electrons to pass through the gate insulating film by quantum effect called as direct tunneling, so that the leakage current is increased and the film does not function as an insulating film.

Hence, a high dielectric constant (high-k) material having a higher dielectric constant than silicon oxide has been introduced for the gate insulating film. This is because, when the gate insulating film is formed of the high dielectric constant material, even if an insulating capacity in terms of a silicon oxide film thickness is the same, since the actual physical film thickness can be made thicker by (dielectric constant of the high dielectric constant material/dielectric constant of silicon oxide) times, the leakage current can be reduced while maintaining the drivability. Consequently, an EOT (equivalent oxide thickness, film thickness in terms of silicon oxide) of the gate insulating film is thinned (lessened) by using the high dielectric constant film having a physical film thickness functioning as the insulating film, thereby improving transistor characteristics.

Further, in the case where the gate electrode is formed of only polysilicon which has been conventionally used, such phenomenon occurs that polysilicon is depleted in an interface of the gate insulating film and the gate electrode. Since the depleted polysilicon film functions as a capacitor insulating film, even if the EOT is thinned down by using the high dielectric constant material, the thickness of the gate insulating film is substantially made thicker by that much of the depleted polysilicon. Hence, because of the capacitance being lessened between the gate electrode and the semiconductor substrate, securement of sufficient on-state current becomes difficult.

Hence, in the case where the high dielectric constant material is used for the gate insulating film, the use of metal instead of polysilicon as a gate electric material disposed on the gate insulating film is being considered.

Further, when the high speed property and the low power consumption property of the transistor are considered, a low threshold voltage is required, and therefore, need arises to design in accordance with the desired threshold voltage. However, in the case where the high dielectric constant material is used for the gate insulating film, a problem arises in which controllability of the threshold voltage becomes low due to phenomenon (Fermi Level Pinning) in which the Fermi level of the electrons in the insulating film is fixed. The threshold voltage greatly depends on an effective work function, and therefore, the effective work function may be controlled to obtain a desired threshold voltage. Further, the effective work function is different from the physical work function due to various factors of the MIS structure.

Hence, for example, Hf (hafnium)-based oxide is introduced as the high dielectric constant material, and a metal oxide is diffused (added) or laminated on the Hf-based oxide, thereby controlling the effective work function of the MIS transistor. For example, H. N. Alshareef et al., Symp. VLSI Tech. Dig., p. 10, 2006 (Non-Patent Document 1) discloses a technique for forming the gate insulating film by diffusing $La_2O_2$ into Hf(Si)O. Further, H-S. Jung, et al., Symp. VLSI Tech., Dig., p. 204, 2006 (Non-Patent Document 2) discloses a technique for forming the gate insulating film by laminating AlO on Hf(Si)O. Further, T. Schram, et al., Symp. VLSI Tech. Dig., p. 44, 2008 (Non-Patent Document 3) discloses a technique for forming the gate insulating films of n-MIS and p-MIS by laminating $La_2O_2$ and $Al_2O_3$ on HfSiO (N), respectively.

SUMMARY OF THE INVENTION

To form a MIS transistor, it is the common practice to use an insulating film for its gate insulating film, and also to use a conductive film having a conductivity including a metal film, which does not exert influence on the gate insulating film, for its gate electrode. Hence, the most appropriate materials to the gate insulating film and the gate electrode are used from during the manufacturing process. The high dielectric constant material is used to the gate insulating film to thin down the EOT, and further, this is considered to be true with the case of forming the MIS transistor controlled in threshold value and effective work function. In this case, the present inventors have found out the following problems, which will be described with reference to FIGS. 30A-30C. FIGS. 30A-30C are diagrams for describing a MIS transistor which uses a high dielectric constant material to a gate insulating film studied by the present inventors, and the MIS transistor is illustrated by FIGS. 30A, 30B, and 30C in an order of the manufacturing processes.

First, in FIG. 30A, for example, a base insulating film 102 (high dielectric constant film) serving as a base material of the gate insulating film is formed on a semiconductor substrate (hereinafter, simply referred to as substrate) 101 made of silicon (Si), and, as an admixture to the base material, a thin metal oxide film 103 is formed in lamination. In the present application, the "admixture" is used as the material to be mixed (diffused) into other material (for example, the base material).

These base insulating film 102 and the metal oxide film 103 form a gate insulating film 104 (mixed film) as illustrated in FIG. 30B, in which the constituent element of the metal oxide film 103 of the admixture is diffused into the base insulating film 102 of the base material by annealing treatment (thermal treatment). To form the MIS transistor in this manner, the base insulating film 102 and the metal oxide film 103, both of which are the insulating films, are used for a gate insulating film of the MIS transistor. After that, in FIG. 30C, a gate electrode 105 is formed on the gate insulating film 104. To form the gate electrode 105 of the MIS transistor, the conductive film having conductivity and including the metal film not exerting influence on the gate insulating film is used. Even if the constituent element of the metal oxide film 103 is not diffused into the base insulating film 102, the case of constituting the gate insulating film 104 in a laminated state is also considered.

For example, as described in Non-patent Document 1, HfSiO is used as the base insulating film 102, and $La_2O_3$ is used as the metal oxide film 103, and HfLaSiO can be used for the gate insulating film 104, and TaN can be applied to the gate electrode 105. Further, as described in Non-patent document 2, Hf(Si)O is used as the base insulating film 102, and the AlO is used as the metal oxide film 103, and a laminated structure of them can be used for the gate insulating film 104, and polysilicon can be used for the gate electrode 105. Further, as described in Non-patent Document 3, HfSiO(N) is used as the base insulating film 102, and $La_2O_3$ or $Al_2O_3$ is used as the metal oxide film 103, and a laminated structure of them can be used for the gate insulating film 104.

To form the MIS transistor in this manner, the insulating film (HfSiO and $La_2O_3$ in Non-patent Document 1) including the oxide film is used for the gate insulating film from during the manufacturing process, and with the conductive film (TaN in the non-patent document 1) including the metal film having conductivity and not exerting influence on the gate insulating film can be used for the gate electrode. Thereby, as described with reference to FIGS. 30A-30C, the oxide film (the base insulating film) serving as the base material and another thin metal oxide film serving as the admixture are subjected to an annealing treatment in a laminated state, so that the effective work function of the MIS transistor can be controlled by diffusing the constituent element of the metal oxide film into the base insulating film.

However, since two insulating films of the base insulating film and the metal oxide film are laminated, the EOT becomes thick, and as a result, there is a possibility that the insulating capacitance becomes smaller than a capacitance value of the base insulating film only. In the miniaturization of the transistor, this factor deteriorates the transistor characteristics such as drivability.

An object of the present invention is to provide a technique for improving the transistor characteristics of the MIS transistor.

The above and other objects and novel characteristics of the present invention will be apparent from the description of the present specification and the accompanying drawings.

The typical ones of the inventions disclosed in the present application will be briefly described as follows.

An embodiment of the present invention is a method of manufacturing a semiconductor device having a MIS transistor, the method including the following steps. (a) Forming a silicon oxide film on a main surface of a semiconductor substrate. (b) Forming a first hafnium-based oxide film on the silicon oxide film. (c) Forming a metal film on the first hafnium-based oxide film. (d) Diffusing a metal element forming the metal film into the first hafnium-based oxide film, thereby forming a second hafnium-based oxide film including the metal element as a compound on the silicon oxide film. (e) Forming a conductive film different from the metal film on the second hafnium-based oxide film, after the step (d). And, (f) forming a gate insulating film including a gate electrode including the conductive film, the second hafnium-based oxide film, and the silicon oxide film by patterning the conductive film, the second hafnium-based oxide film, and the silicon oxide film into a predetermined shape after the step (e), thereby forming a gate electrode including the conductive film, and a gate insulating film including the second hafnium-based oxide film and the silicon oxide film. In the present application, the "hafnium-based oxide film" is higher in dielectric constant than silicon oxide, and is referred to as an oxide film (high dielectric constant film) formed including hafnium (Hf) and oxygen (O). The hafnium-based oxide film includes, for example, hafnium oxide ($HfO_2$) film, hafnium oxide magnesium (HfMgO) film, and hafnium oxide aluminum (HfAlO).

Further, another embodiment of the present invention is a semiconductor device including a MIS transistor provided with the following configuration. This semiconductor device includes: a silicon oxide film provided on a main surface of a semiconductor substrate; a mixed film (high dielectric constant film) provided on the silicon oxide film and higher in dielectric constant than silicon oxide and including hafnium, oxygen, and a metal element; and a conductive film provided on the mixed film. Here, a gate electrode of the MIS transistor is formed of the conductive film, and a gate insulating film of the MIS transistor is formed of the silicon oxide film and the mixed film, and the EOT of the gate insulating film is set below 1.5 nm.

The effects obtained by typical aspects of the present invention will be briefly described below.

According to the embodiment, the transistor characteristics of the MIS transistor can be improved.

BRIEF DESCRIPTIONS OF THE DRAWINGS

FIG. 5 is a table illustrating various metal oxides and electronegativity thereof;

Figure 29:
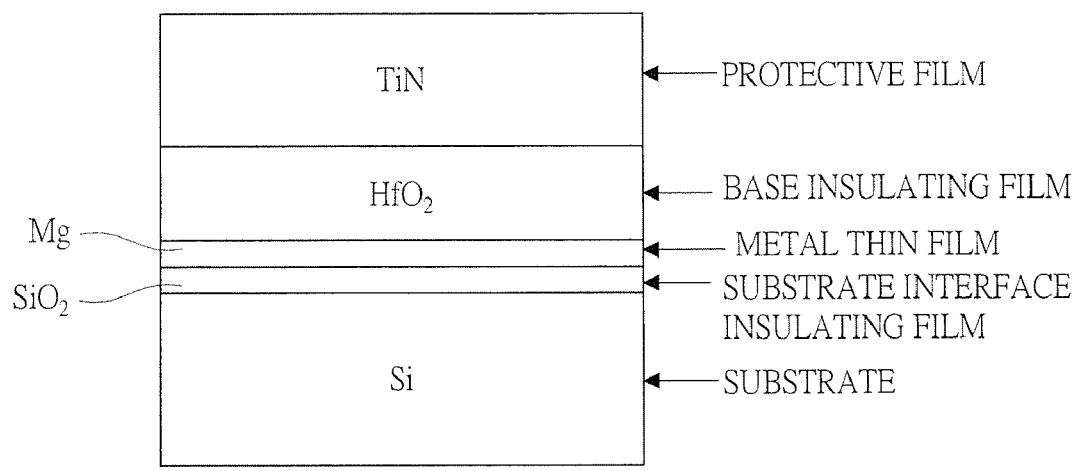
Figure 29:
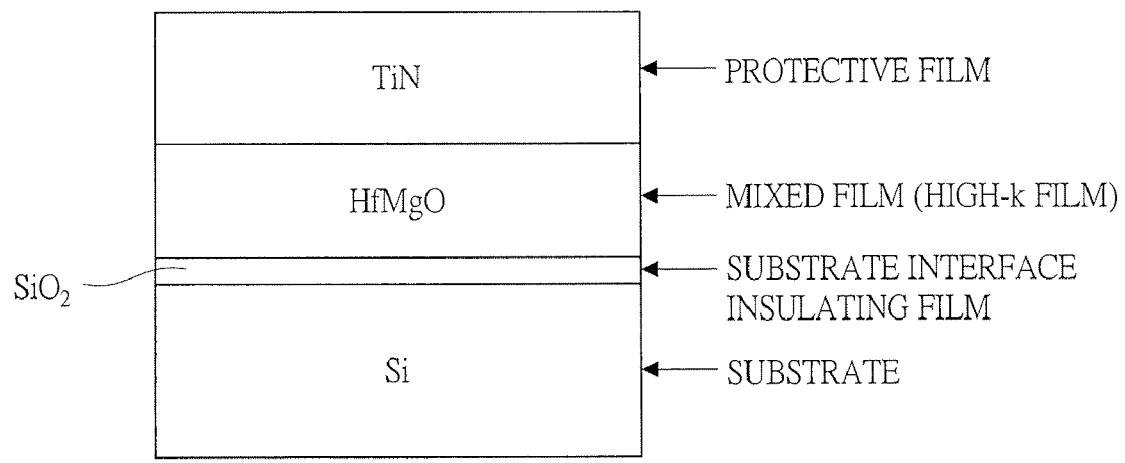
Figure 30A:
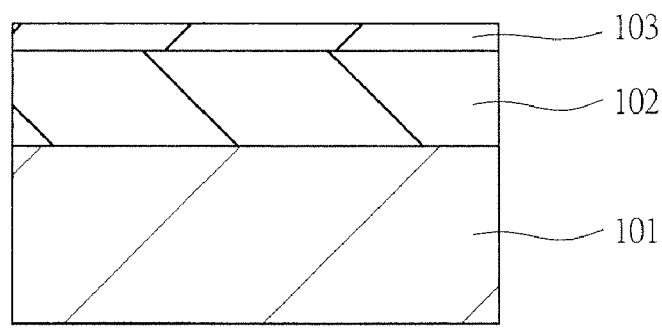
Figure 30B:
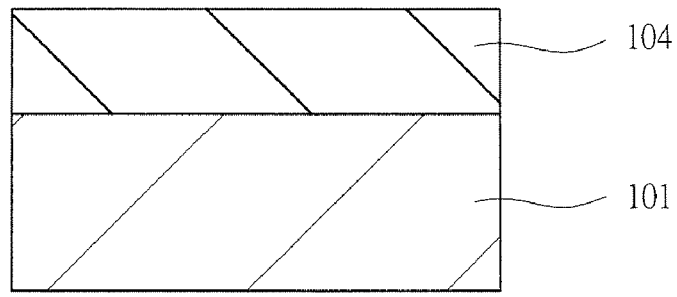
Figure 30C:
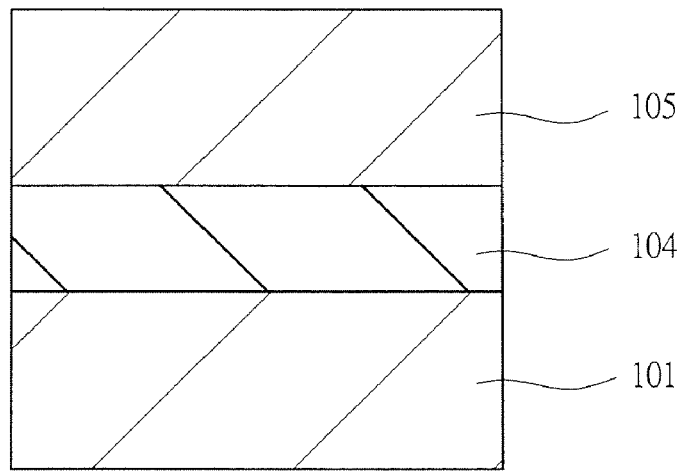

FIG. 29 is a diagram for describing the formation of a high dielectric constant film in the still another embodiment of the present invention; and FIGS. 30A-30C are diagrams for describing a MIS transistor in which a high dielectric constant material is used for a gate insulating film studied by the present inventors, illustrated in an order of a manufacturing process of FIG. 30A, FIG. 30B, and FIG. 30C.

DESCRIPTIONS OF THE PREFERRED EMBODIMENTS

Hereinafter, embodiments of the present invention will be described in detail with reference to the accompanying drawings. Note that, components having the same function are denoted by the same reference symbols throughout the drawings for describing the embodiment, and the repetitive description thereof will be omitted. Also, in some drawings for describing the following embodiments, hatching may be used even in a plan view so as to make the drawings easy to see.

First Embodiment

A first embodiment will be described about a case in which the present invention is applied to a semiconductor device provided with an SRAM (static random access memory).

Figure 1:
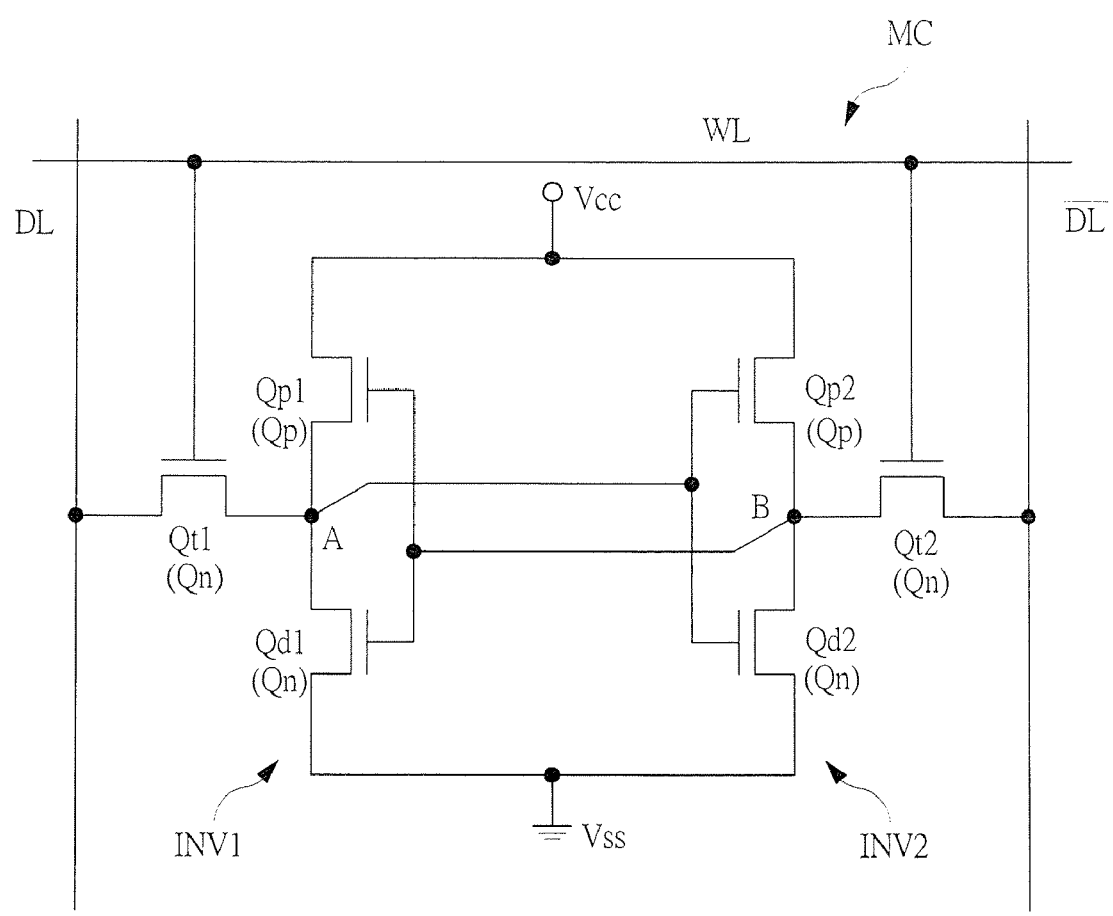
FIG. 1 is an equivalent circuit diagram illustrating a memory cell of an SRAM included in a semiconductor device according to an embodiment of the present invention.

FIG. 1 is an equivalent circuit diagram illustrating a memory cell MC of the SRAM constituting the semiconductor device of the present embodiment. As illustrated in FIG. 1, this memory cell MC is disposed on intersection portions with a pair of complementary data lines (data line DL and data line/DL (bar DL)) and a word line WL, and is constituted of a pair of driving MIS transistors Qd1 and Qd2, a pair of load MIS transistor Qp1 and Qp2, and a pair of transferring MIS transistors Qt1 and Qt2. The driving MIS transistors Qd1 and Qd2 and the transferring MIS transistors Qt1 and Qt2 are constituted of n-channel type MIS transistors (hereinafter, referred to as n-MIS transistor) Qn, and the load MIS transistors Qp1 and Qp2 are constituted of p-channel type MIS transistors (hereinafter, referred to as p-MIS transistor) Qp.

Out of these six MIS transistors constituting the memory cell MC, the driving MIS transistor Qd1 and the load MIS transistor Qp1 constitute an inverter INV1 as a CMIS (complementary MIS), and the driving MIS transistor Qd2 and the load MIS transistor Qp2 constitute an inverter INV2 as a CMIS. The input/output terminals (storage nodes A and B) of the pair of these inverters INV1 and INV2 are mutually cross-coupled, and constitute a flip-flop circuit as an information storage portion for storing 1-bit information.

One of the input/output terminals (storage node A) of this flip-flop circuit is connected to one of a source region and a drain region of the transferring MIS transistor Qt1, and the other input/output terminal (storage node B) is connected to one of a source region and a drain region of the transferring MIS transistor Qt2. Further, the other source region and drain region of the transferring MIS transistor Qt1 are connected to the data line DL, and the other source region and drain region of the transferring MIS transistor Qt2 are connected to the data line/DL.

Further, one of the terminals (each source region of the load MIS transistors Qp1 and Qp2) of the flip-flop circuit is connected to a power source voltage (Vcc), and the other terminal (each source region of the driving MIS transistors Qd1 and Qd2) is connected to a reference voltage (Vss).

Describing the operation of this circuit, when the storage node A of one inverter INV1 is at a high potential ("H"), the driving MIS transistor Qd2 is turned on, and therefore, the storage node B of the other inverter INV2 becomes low potential ("L"). Consequently, the driving MIS transistor Qd1 is turned off, and the high potential ("H") of the storage node A is maintained. That is, the states of the storage nodes A and B are mutually maintained by a latch circuit having the cross-coupled pair of inverters INV1 and INV2, and the information is held as long as the power source voltage is being applied.

The respective gate electrodes of the transferring MIS transistors QT1 and Qt2 are connected with the word line WL, and by this word line WL, conduction and non-conduction of the transferring MIS transistors Qt1 and Qt2 are controlled. That is, when the word line WL is at a high potential ("H"), the transferring MIS transistors Qt1 and Qt2 are turned on, so that the latch circuit and complementary data lines (data lines DL and /DL) are electrically connected, and therefore, the potential states ("H" or "L") of the storage nodes A and B appear on the data lines DL and /DL, and can be read as the information on the memory cell MC.

To write information in the memory cell MC, the word line WL is put into the "H" potential level, and the transferring MIS transistors Qt1 and Qt2 are put into an on-state, thereby transferring the information on the data line DL and /DL to the storage nodes A and B. In the above-described manner, the SRAM can be operated.

Figure 2:
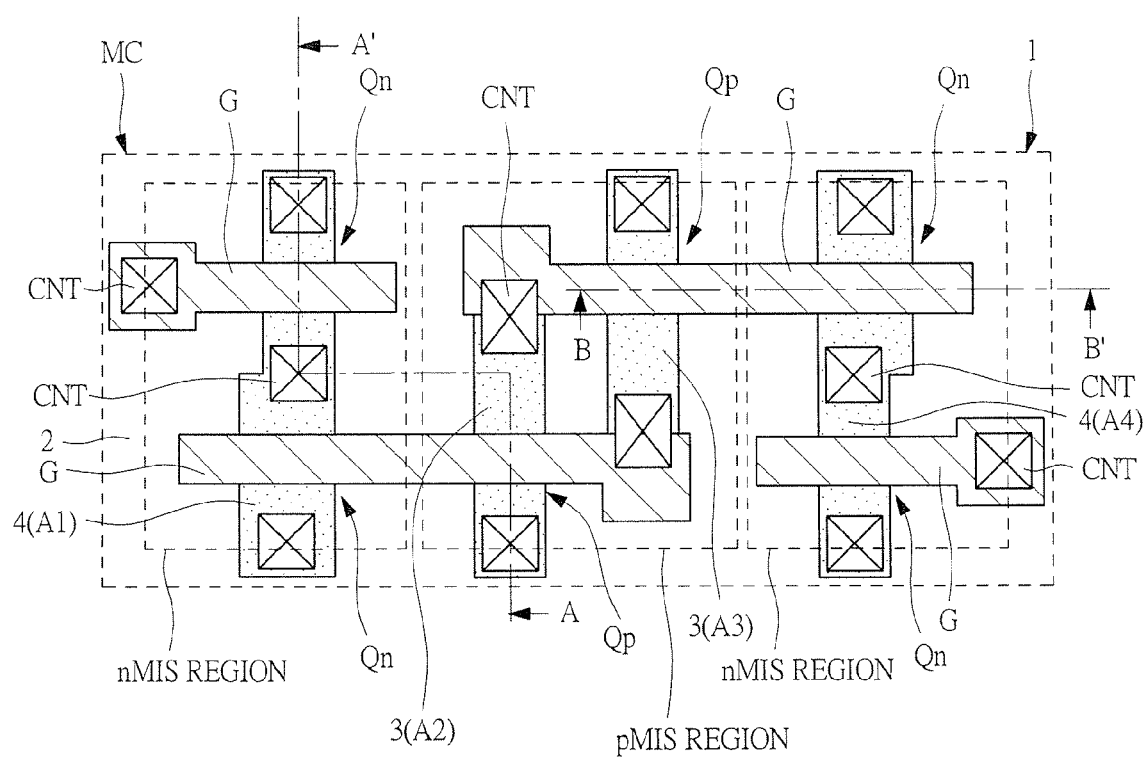
FIG. 2 is a plan view schematically illustrating main parts of the semiconductor device according to the embodiment of the present invention.
Figure 3:
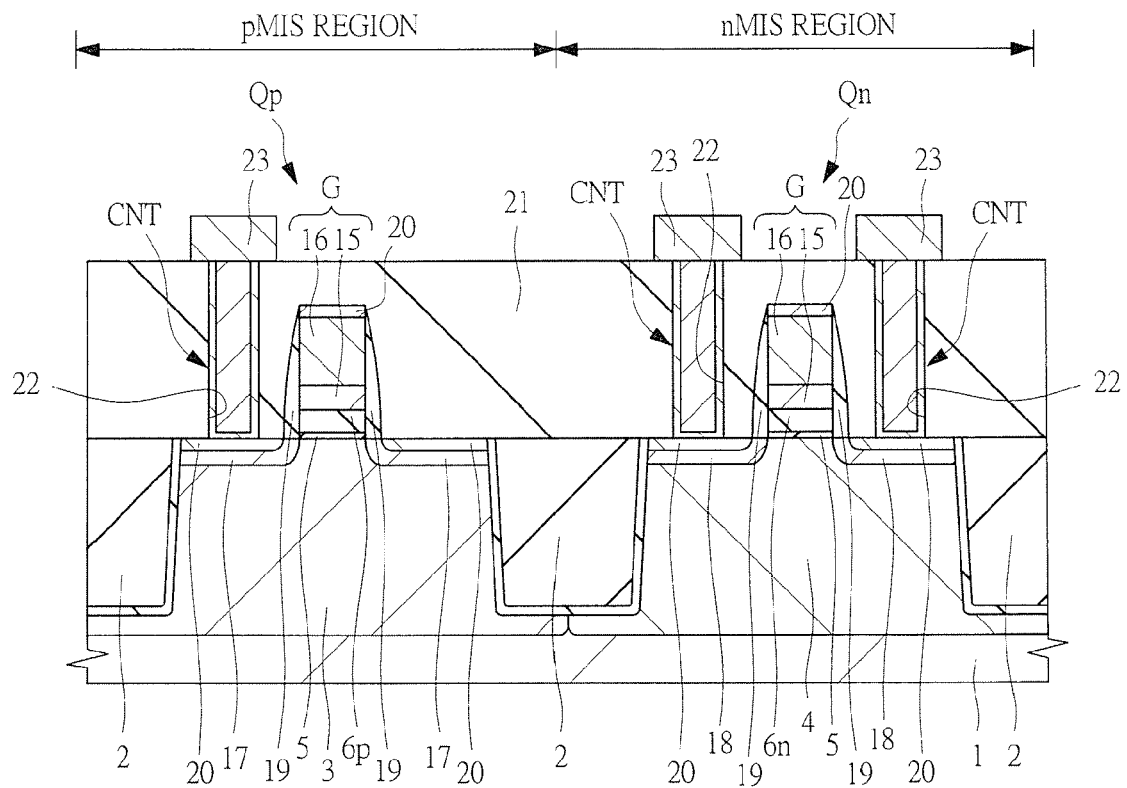
FIG. 3 is a cross-sectional view schematically illustrating the semiconductor device taken along the line A-A' of FIG. 2.
Figure 4:
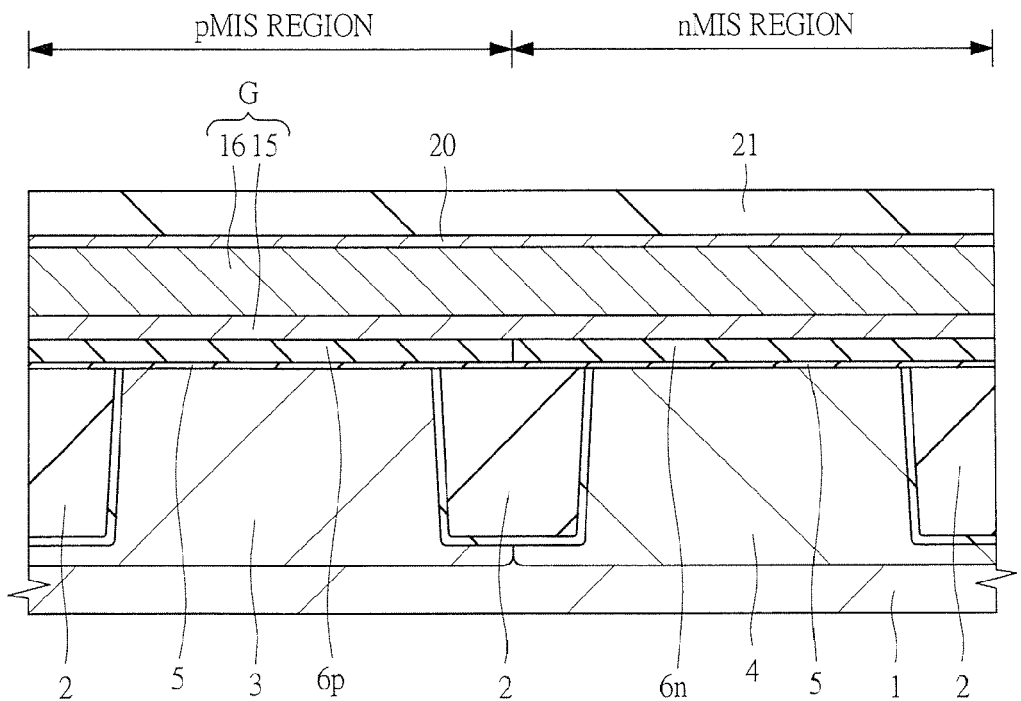
FIG. 4 is a cross-sectional view schematically illustrating the semiconductor device taken along the line B-B' of FIG. 2.

FIG. 2 is a plan view schematically illustrating main parts (memory cell MC of FIG. 1) of the semiconductor device of the present embodiment, FIG. 3 is a cross-sectional view schematically illustrating the semiconductor device taken along the line A-A' of FIG. 2, and FIG. 4 is a cross-sectional view schematically illustrating the semiconductor device taken along the line B-B' of FIG. 2. In FIG. 2, to clarify the relationship between a gate electrode G and an n-well 3 and a p-well 4 which constitute active regions, a part of the components such as an interlayer insulating film 21 as illustrated in FIGS. 3 and 4 is omitted. Further, though not illustrated in FIGS. 3 and 4, the semiconductor device of the present embodiment may be a multilayer wiring structure, and the uppermost surface is provided with a protective film (passivation film). Further, a p-MIS region illustrated in FIGS. 2 to 4 is a region formed with a p-MIS transistor, and an n-MIS region is a region formed with an n-MIS transistor.

First, a layout structure of the SRAM in the present embodiment will be described. As illustrated in FIG. 2, a substrate 1 is partitioned into a plurality of active regions A1 to A4 (n-well 3 and p-well 4) by an device isolation region 2. In the p-well 4 (active regions A1 and A4) for forming the n-MIS transistor Qn, semiconductor regions (source/drain) not illustrated are formed by introducing an n-type impurity such as phosphor or arsenic, and the gate electrode G is formed on the p-well 4 (active regions A1 and A4) between these source and drain regions interposing the gate insulating film. Similarly, in the n-well 3 (active regions A2 and A3) for forming the p-MIS transistor Qp, semiconductor regions (source/drain) not illustrated are formed by introducing a p-type impurity such as boron, and the gate electrode G is formed on the n-well 3 (active regions A2 and A3) between these source and drain regions interposing the gate insulating film. In FIG. 2, the gate electrode G extends in a second direction (horizontal direction in the figure) which intersects a first direction (vertical direction in the figure) in which the active region extends.

For example, in the memory cell MC of the SRAM illustrated in FIG. 1, the driving MIS transistor Qd1 and the transferring MIS transistor Qt1 are formed in the same active region A1 by the source region and the drain region and two gate electrodes G formed in the active region A1. Further, the load MIS transistor Qp1 is formed by the source region and the drain region and the gate electrode G formed in the active region A2, and the load MIS transistor Qp2 is formed by the source region and the drain region and the gate electrode G formed in the active region A3. Further, the driving MISFET Qd2 and the transferring MISFET Qt2 are formed in the same active region A4 by the source region and the drain region and the gate electrode G formed in the active region A4.

Such an SRAM as described above is formed on the substrate 1. Further, a plurality of memory cells MC composed of six MIS transistors is formed in the SRAM, and in addition, a substrate potential supply portion for obtaining a potential is formed because of the SRAM structure, and these are electrically connected through contacts CNTs and wirings. Note that, as illustrated in FIGS. 2 and 4, the gate electrodes of the driving MIS transistors Qd1 and Qd2 and the gate electrodes of the load MISFETs Qp1 and Qp2 are formed as one gate electrode G.

Next, the structure of the n-MIS transistor Qn of the present embodiment will be described. As illustrated in FIGS. 3 and 4, the p-well 4 is formed in the n-MIS region of the substrate 1 formed of, for example, p-type single-crystal silicon, and in the p-well 4, an n-MIS transistor Qn has the gate electrode G on the substrate 1 interposing the gate insulating film.

The gate insulating film of this n-MIS transistor Qn is a laminated film formed of a silicon oxide film ($SiO_2$ film 5) provided on a main surface (element forming surface) of the substrate 1 and a HfMgO film 6n of a high dielectric constant film provided on the $SiO_2$ film 5 and having a higher dielectric constant than silicon oxide ($SiO_2$) including hafnium (Hf), oxygen (O), and magnesium (Mg) that is a metal element. The HfMgO film 6n may have a configuration (HfMgON) including nitrogen (N).

Further, the gate electrode G is made of a conductive material including metals, and has a TiN film 15 on the gate insulating film of the n-MIS transistor Qn, and has a polysilicon film 16 on the TiN film 15. The surface of the gate electrode G (polysilicon film 16) is formed with a silicided silicide film 20 (for example, nickelsilicide film and nickel-cobalt film). The TiN film 15 directly contacts the gate insulating film, and is mainly used for adjusting the threshold voltage of the n-MIS transistor Qn. On the other hand, the polysilicon film 16 is mainly used for lowering the resistance of the gate electrode G. Further, sidewalls 19 are formed to side walls of both sides of the gate electrode G. This sidewall 19, for example, is formed of an insulating film such as a silicon nitride film.

Further, the inside of the p-well 4 directly below the side wall 19 is formed with n-type semiconductor regions (source/drain) 18 provided with being aligned with the gate electrode G. These n-type semiconductor regions (source/drain) 18 are impurity regions formed by introducing an n-type impurity such as phosphor (P) and arsenic (As), or the like into the substrate 1. The surfaces of these n-type semiconductor regions (source/drain) 18 are formed with the silicide films 20 with being aligned with the side wall 19 to improve connectivity with the contact CNT. In this manner, the source region and the drain region of the n-MIS transistor Qn are formed by the pair of n-type semiconductor regions 18.

In the present embodiment, an EOT of the gate insulating film of the n-MIS transistor Qn is set to be smaller than or equal to 1.5 nm. Specifically, the $SiO_2$ film 5 is set to 0.5 nm or the like, and the HfMgO film 6n is set to 2 to 3 nm or the like. Thereby, a leakage current is suppressed as compared with the case where the gate insulating film is formed of the silicon oxide film only, and the transistor driving ability such as the increase and the like of the on-state current can be improved while miniaturizing and integrating the MIS transistor.

Further, in the present embodiment, the HfMgO film 6n of the high dielectric constant film is applied to the gate insulating film of the n-MIS transistor Qn, so that the EOT of the gate insulating film is set to be smaller than or equal to 1.5 nm. The high dielectric constant film capable of obtaining the same effect as the HfMgO film in this manner is higher in dielectric constant than silicon oxide, and includes hafnium, oxygen, and a metal element, and therefore, a HfLaO film, a HfGdO film, a HfYO film and the like can be cited as an example. Magnesium (Mg), lanthanum (La), gadolinium (Gd), and yttrium (Y) of the metal elements included in these high dielectric constant films are metal elements constituting metal oxide smaller in electronegativity than hafnium oxide (HfO$_2$) as shown in the Table of FIG. 5.

In this manner, the high dielectric constant film including the metal element like lanthanoid-based metal such as magnesium (Mg), lanthanum (La), or the like constituting a metal oxide smaller in electronegativity than hafnium oxide (HfO$_2$) is used for the gate insulating film, so that the effective work function can be controlled and the n-MIS transistor Qn can be constituted. The effective work function is set up in the vicinity (vicinity of 4.1 eV) of a conduction band of silicon, thereby lowering the threshold voltage of the n-MIS transistor. Further, a high dielectric constant film capable of obtaining the same effect as the HfMgO film includes a HfBaO film or the like containing barium (Ba) in a hafnium oxide film in addition to those films as described above.

Next, the configuration of the p-MIS transistor Qp of the present embodiment will be described. As illustrated in FIGS. 3 and 4, for example, the p-MIS region of the substrate 1 formed of p-type single-crystal silicon is formed with the n-well 3, and in this n-well 3, the p-MIS transistor Qp has the gate electrode G on the substrate 1 interposing the gate insulating film.

The gate insulating film of this p-MIS transistor Qp is a laminated film constituted of the silicon oxide film (SiO$_2$ film 5) provided on the main surface of the substrate 1 and a HfAlO film 6p that is a high dielectric constant film provided on the SiO$_2$ film 5 and higher in dielectric constant than silicon oxide (SiO$_2$) and including hafnium (Hf), oxygen (O), and aluminum (Al) that is a metal element. The HfAlO film 6p may have a configuration (HfAlON) including nitrogen (N).

Further, the gate electrode G is formed of a conductive material including metals, and has the TiN film 15 on the gate insulating film of the p-MIS transistor Qp, and has the polysilicon film 16 on the TiN film 15. The surface of the gate electrode G (polysilicon film 16) is formed with the silicided silicide film 20. The TiN film 15 directly contacts the gate insulating film, and is mainly used for adjusting the threshold voltage of the p-MIS transistor Qp. On the other hand, the polysilicon film 16 is mainly used for lowering the resistance of the gate electrode G. Further, side walls of both sides of the gate electrode G are formed with the sidewalls 19. This sidewall 19, for example, is formed of an insulating film such as a silicon nitride film.

Further, the inside of the n-well 3 directly below the side wall 19 is formed with p-type semiconductor regions (source/drain) 17 provided with being aligned with the gate electrode G. These p-type semiconductor regions (source/drain) 17 are impurity regions formed by introducing a p-type impurity such as boron (B) into the substrate 1. The surfaces of the p-type semiconductor regions (source/drain) 17 are formed with the silicide films 20 with being aligned with the side walls 19 to improve the connectivity with the contact CNTs. In this manner, the source region and the drain region of the p-MIS transistor Qp are formed by the pair of p-type semiconductor regions 17.

In the present embodiment, the EOT of the gate insulating film of the p-MIS transistor Qp is set to be smaller than or equal to 1.5 nm. Specifically, the SiO$_2$ film 5 is set to 0.5 nm and the like, and the HfAlO film 6p is set to 2 to 3 nm and the like. Thereby, a leakage current is suppressed as compared with the case where the gate insulating film is formed of a silicon oxide film only, and the transistor drivability such as the increase of the on-state current can be improved while miniaturizing and integrating the MIS transistor.

Further, in the present embodiment, the HfAlO film 6p that is a high dielectric constant film is used for the gate insulating film of the p-MIS transistor Qp, thereby making the EOT of the gate insulating film be smaller than or equal to 1.5 nm. In this manner, the high dielectric constant film capable of obtaining the same effect as the HfAlO film is higher in dielectric constant than silicon oxide, and includes hafnium, oxygen, and a metal element, and therefore, a HfTiO film, a HfTaO film, and the like can be cited as an example. Aluminum (Al), titanium (Ti), and tantalum (Ta) of metal elements included in these high dielectric constant films are metal elements to form a metal oxide larger in electronegativity than hafnium oxide (HfO$_2$) as listed in the Table of FIG. 5.

In this manner, the high dielectric constant film including a metal element such as aluminum (Al), titanium (Ti), or tantalum (Ta) forming a metal oxide smaller in electronegativity than hafnium oxide (HfO$_2$) is used for the gate insulating film, so that the effective work function can be controlled and the p-MIS transistor Qp can be constituted. The effective work function is set up in the vicinity (vicinity of 5.2 eV) of the conduction band of silicon, so that the threshold voltage of the p-MIS transistor can be lowered.

As described above, the n-MIS region of the substrate 1 is formed with the n-MIS transistor Qn, and the p-MIS region of the substrate 1 is formed with the p-MIS transistor Qp. By constituting a CMIS from such n-MIS transistor Qn and p-MIS transistor Qp, the performance of the semiconductor device can be enhanced. Specifically, the threshold value of the CMIS can be lowered, and the CMIS having a high on-state current and a low consumption power can be realized.

Next, a method of manufacturing the n-MIS transistor Qn and the p-MIS transistor Qp constituting the semiconductor device according to the present embodiment will be described with reference to the drawings. FIGS. 6 to 18 are cross-sectional views schematically illustrating main parts of the semiconductor device in a manufacturing process according to the present embodiment, and are cross-sectional views taken along the line A-A' of FIG. 2.

Figure 6:
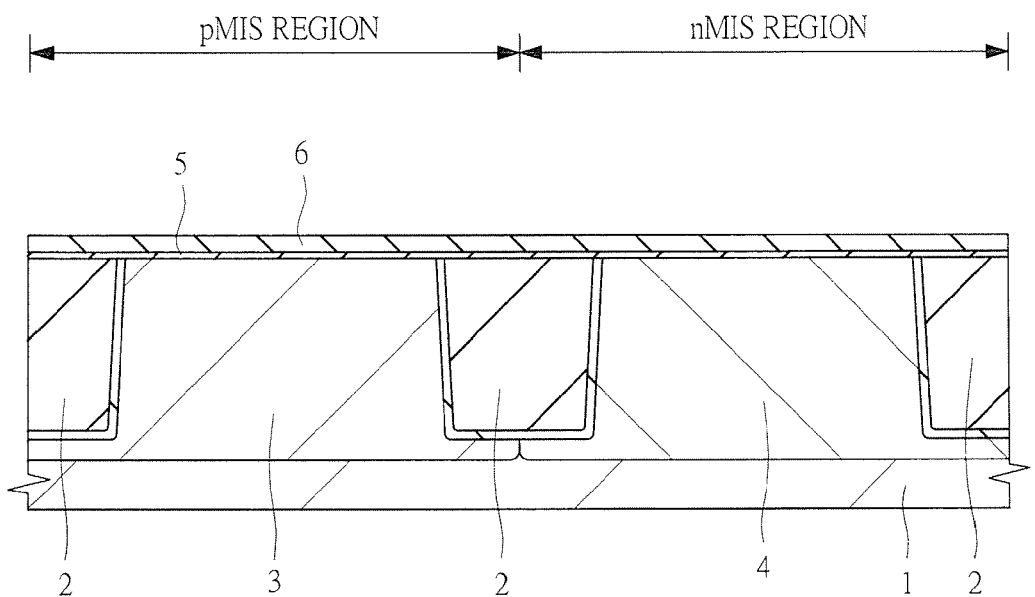
FIG. 6 is a cross-sectional view schematically illustrating main parts of a semiconductor device in a manufacturing process according to an embodiment of the present invention.

First, for example, the substrate 1 formed of p-type single-crystal silicon is prepared, and is subjected to surface treatment, and after that, as illustrated in FIGS. 6 and 2, a device isolation region 2 for partitioning active regions on the main surface (element forming surface) of the substrate 1 is formed. In the present embodiment, the device isolation region 2 is an STI (shallow trench isolation) constituted of the silicon oxide film buried into a device isolation trench having, for example, a depth of about 250 nm to 400 nm formed in the substrate 1, for example, by using a CVD method. At this device isolation region 2, a boundary of the p-MIS region and the n-MIS region is positioned. In this manner, the substrate 1 having the p-MIS region in which a p-MIS transistor constituting one CMIS will be formed and the n-MIS region in which the n-MIS transistor constituting the other CMIS will be formed is prepared.

Subsequently, as illustrated in FIGS. 6 and 2, the n-well 3 is formed, in which a p-channel of the p-MIS transistor will be formed in the p-MIS region of the substrate 1. Further, the p-well 4 is formed, in which an n-channel of the n-MIS transistor will be formed in the n-MIS region. The n-well 3 is formed by introducing an n-type impurity such as phosphor (P) or arsenic (As) into the substrate 1 by using an ion implantation method. Further, the p-well 4 is formed by introducing a p-type impurity such as boron (B) or boron fluoride (BF$_2$) into the substrate 1 by an ion implantation method.

Subsequently, as illustrated in FIG. 6, the silicon oxide film (SiO$_2$ film 5) is formed on the main surface of the substrate 1 with a thickness of about 0.5 nm as an interface layer. Since silicon is used for the substrate 1, the SiO$_2$ film 5 is formed, for example, by performing thermal treatment in an oxygen atmosphere. Since this SiO$_2$ film 5 generates a dipole (electronic dipole) in the interface of the $SiO_2$ film 5 and the high dielectric constant film formed on the $SiO_2$ film 5 in the subsequent step, the $SiO_2$ film 5 is considered to exert influence on the effective work function of the MIS transistor.

Subsequently, as illustrated in FIG. 6, the hafnium oxide film ($HfO_2$ film 6) having a thickness of about 2 to 3 nm is formed on the $SiO_2$ film 5. In the present embodiment, the $HfO_2$ film 6 is formed as a membranous base material (hereinafter, referred to also as base insulating film) thicker than the $SiO_2$ film 5 and including hafnium (Hf) and oxygen (O). The $HfO_2$ film 6 is formed, for example, by using an ALD (atomic layer deposition) method, a CVD method or a sputtering method. Since this $HfO_2$ film 6 is, for example, higher in dielectric constant than silicon oxide, it is a high dielectric constant film. In the subsequent process, the metal element is diffused (mixed) into this $HfO_2$ film 6 serving as the base material. The $HfO_2$ film 6 may be nitrided or subjected to thermal treatment lastly in the midst of manufacture as needed.

Figure 7:
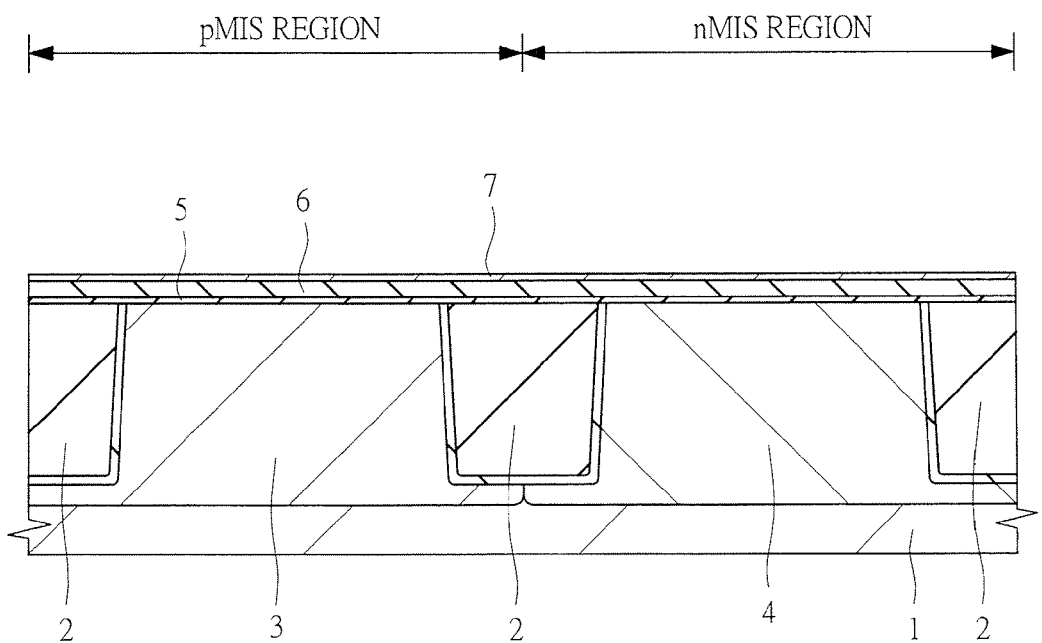
FIG. 7 is a cross-sectional view schematically illustrating main parts of the semiconductor device in the manufacturing process continued from FIG. 6.

Subsequently, as illustrated in FIG. 7, an aluminum film (Al film 7) is formed on the substrate 1, that is, on the $HfO_2$ film 6 serving as the base material, to have a thickness of about 0.5 nm, for example, by using a sputtering method. In the present embodiment, the Al film 7 is formed as a membranous admixture (hereinafter, referred to also as metal thin film) thinner than the $HfO_2$ film 6 serving as the base material and made of a metal element only. In the subsequent step, the constituent element (metal element) of the Al film 7 serving as the admixture is diffused into the $HfO_2$ film 6 serving as the base material, thereby constituting the gate insulating film of the p-MIS transistor Qp.

In the present embodiment, to form the gate insulating film of the p-MIS transistor Qp, the Al film 7 of the metal thin film formed of only the metal element instead of metal oxide or nitride exhibiting insulating properties is used. The metal element included in the metal thin film is not limited to aluminum (Al), but may be titanium (Ti) or tantalum (Ta). These metal elements, as listed in the table of FIG. 5, form metal oxides larger in electronegativity than hafnium oxide ($HfO_2$). By diffusing (or mixing) the metal element such as Al, Ti, or Ta into the $HfO_2$ film 6 serving as the base material, the high dielectric constant film (mixed film) to form the gate insulating film of the p-MIS transistor Qp is formed.

Figure 8:
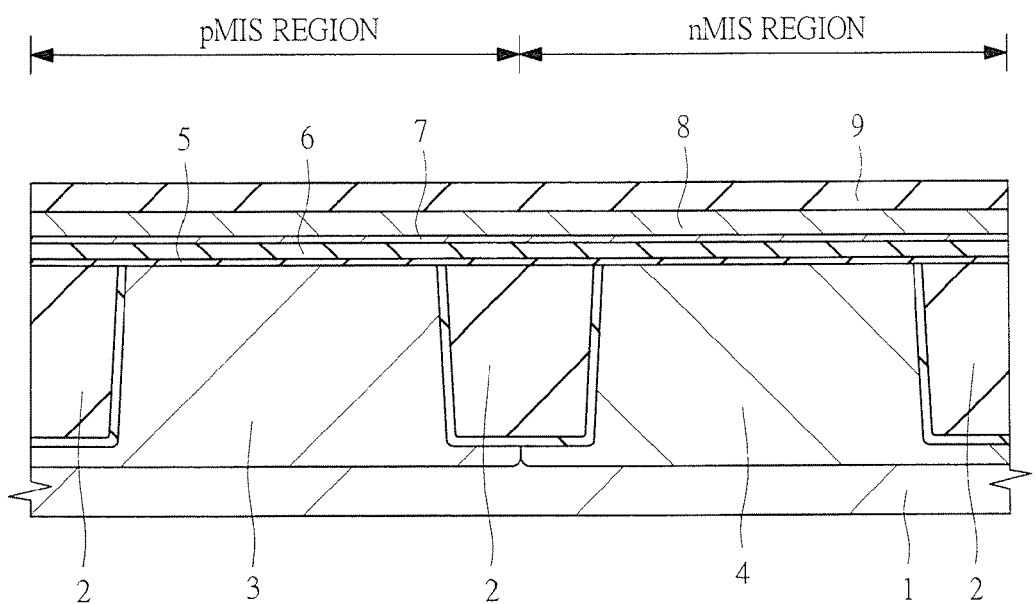
FIG. 8 is a cross-sectional view schematically illustrating main parts of the semiconductor device in the manufacturing process continued from FIG. 7.

Subsequently, as illustrated in FIG. 8, a titanium nitride film (TiN film) 8 having a thickness of about 10 nm is formed on the Al film 7 serving as the admixture. In the present embodiment, the TiN film 8 is used as a film not converting the Al film 7, that is, as a protective film having humidity resistance and oxidation resistance, and also as the protective film having resistance to annealing treatment (thermal treatment) temperature for diffusing the metal element of the Al film 7 serving as the admixture into the $HfO_2$ film 6 serving as the base material in the subsequent process.

In this manner, as long as it is a film not converting the metal thin film (Al film 7), the silicon nitride (SiN) film can be also used as the protective film. However, in the present embodiment, the metal film (metal protective film) is used for the following reason.

In the same manufacturing device (for example, sputtering apparatus) for forming the metal thin film serving as the admixture that is weak to atmospheric (containing $O_2$ and $H_2O$) exposure, to enable continuous film formation in a state in which vacuum is maintained is preferable. In the present embodiment, since the Al film 7 of the metal thin film serving as the admixture is formed by a sputtering apparatus, the TiN film 8 is formed on the Al film 7 as the metal protective film as a metal-based sputtered film capable of being formed in a continuous film formation by using the sputtering method. Thereby, a stable state can be maintained without converting the Al film 7 of the metal thin film.

Further, the reason of using the TiN film 8 as the metal protective film is because titanium nitride whose wet treatment (chemical treatment) material easily removable has been known (for example, $H_2O_2$), and can be removed without giving damages to the Al film 7 of the metal thin film serving as a base. Even other metal nitride as the protective film can be removed by the wet treatment, and can be used if it does not damage the metal thin film of the base.

Figure 9:
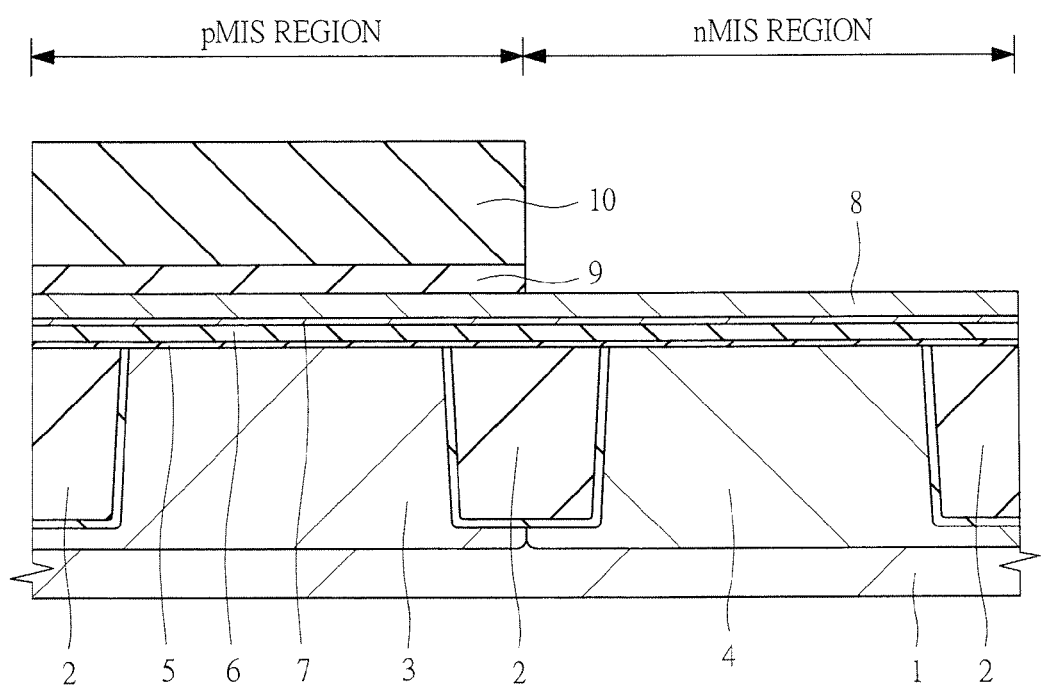
FIG. 9 is a cross-sectional view schematically illustrating main parts of the semiconductor device in the manufacturing process continued from FIG. 8.

Subsequently, as illustrated in FIG. 8, for example, by using a CVD method at a temperature of about 450° C., the silicon nitride film (SiN film) 9 is formed having a thickness of about 10 nm on the TiN film 8 as a hard mask of the subsequent dry etching process. Next, by using photolithographic technique, a resist film 10 is formed on the SiN film 9 (FIG. 9). This resist film 10 is removed in the n-MIS region, and as illustrated in FIG. 9, is used as a mask to cover the SiN film 9 of the p-MIS region. In the manufacturing process illustrated in FIG. 9, as the resist film 10 is provided on the SiN film 9 in its cross-sectional state, so the resist film 10 is also provided in the p-MIS region in its plan view state (see FIG. 2).

Subsequently, as illustrated in FIG. 9, with the resist film 10 used as a mask, the SiN film 9 of the n-MIS region is removed by dry etching, and the SiN film 9 functioning as a hard mask is formed. After that, this resist film 10 is removed, for example, by ashing or the like.

Figure 10:
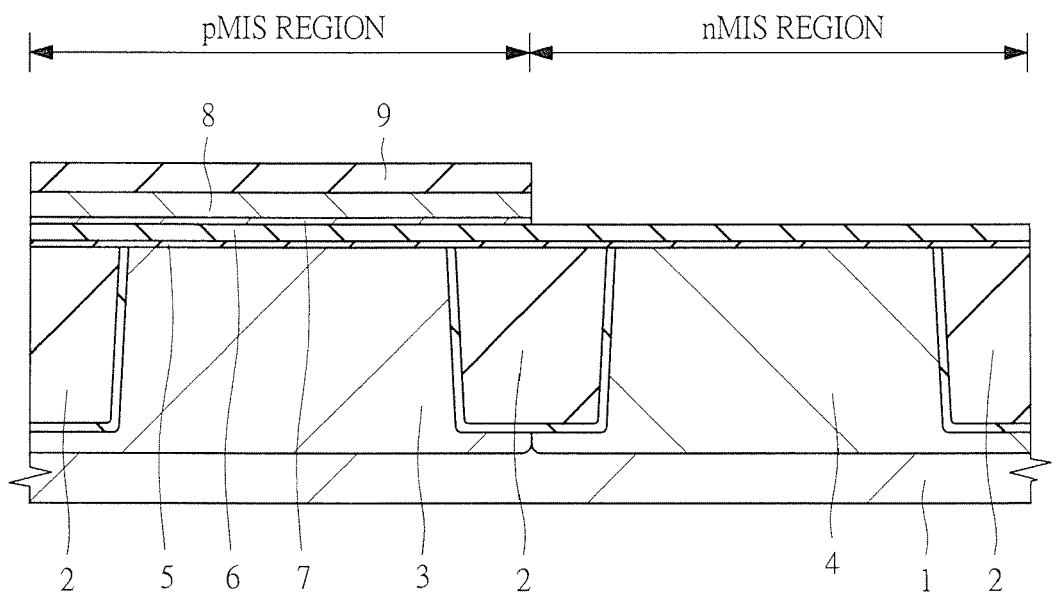
FIG. 10 is a cross-sectional view schematically illustrating main parts of the semiconductor device in the manufacturing process continued from FIG. 9.

Subsequently, as illustrated in FIG. 10, with using the SiN film 9 formed by photolithographic technique and etching technique as a hard mask, the TiN film 8 in the n-MIS region is removed by wet etching, for example, by $H_2O_2$ and rinsing. Next, with using the SiN film 9 as a hard mask, the Al film 7 in the n-MIS region is removed by wet etching, for example, by diluted hydrofluoric acid (hereinafter, denoted as dHF) and rinsing. Thereby, the $HfO_2$ film 6 in the n-MIS region is exposed. In this manner, the Al film 7 of the metal thin film is covered by the TiN film 8 of the protective film, and the Al film 7 is cut and separated together with the TiN film 8, so that the gate electrode material of the p-MIS transistor can be left in the p-MIS region only.

Figure 11:
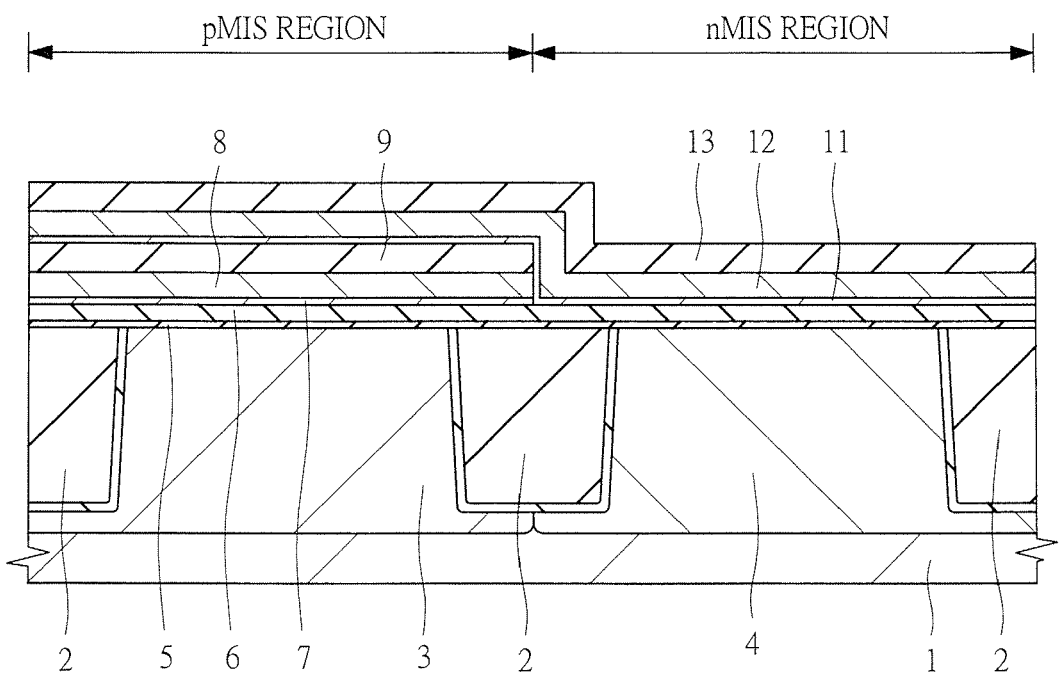
FIG. 11 is a cross-sectional view schematically illustrating main parts of the semiconductor device in the manufacturing process continued from FIG. 10.

Subsequently, as illustrated in FIG. 11, for example, by using the sputtering method, a magnesium film (Mg film 11) is formed to have a thickness of about 0.5 nm on the substrate 1, that is, the $HfO_2$ film 6 serving as the base material. In the present embodiment, the Mg film 11 is formed as a membranous admixture (metal thin film) thinner than the $HfO_2$ film 6 and serves as the base material made of the metal element only. Thereby, the Al film 7 is provided on the $HfO_2$ film 6 of the p-MIS region, and the Mg film 11 made of only the metal element different from a metal element of the p-MIS region is provided on the $HfO_2$ film 6 of the n-MIS region. In the subsequent process, the constituent element (metal element) of the Mg film 11 serving as the admixture is diffused into the $HfO_2$ film 6 serving as the base material, thereby constituting the gate insulating film of the n-MIS transistor Qn.

In the present embodiment, to form the gate insulating film of the n-MIS transistor Qn, the Mg film 11 of the metal thin film formed of only the metal element is used instead of metal oxide or nitride exhibiting insulating properties. The single metal element included in the metal thin film is not limited to magnesium (Mg), but may be lanthanum (La), gadolinium (Gd), or yttrium (Y). These metal elements, as listed in the table of FIG. 5, constitute metal oxides smaller in electronegativity than hafnium oxide ($HfO_2$). By diffusing (or mixing) the metal elements such as Mg, La, or Y into the $HfO_2$ film 6 serving as the base material, a high dielectric constant film (mixed film) constituting the gate insulating film of the n-MIS transistor Qn is formed.

Subsequently, as illustrated in FIG. 11, a titanium nitride film (TiN film) 12 having a thickness of about 10 nm is formed on the Mg film 11 serving as the admixture. In the present embodiment, the TiN film 12 is used as a film not converting the Mg film 11, that is, as a protective film having humidity resistance and oxidation resistance, and further, as a protective film having resistance to annealing treatment (thermal treatment) temperature for diffusing the metal element of the Mg film 11 serving as the admixture into the $HfO_2$ film 6 serving as the base material in the subsequent process. In the present embodiment, the reason of using the TiN film 12 (metal protective film) as the protective film is the same as the reason of using the TiN film 8 described above.

Figure 12:
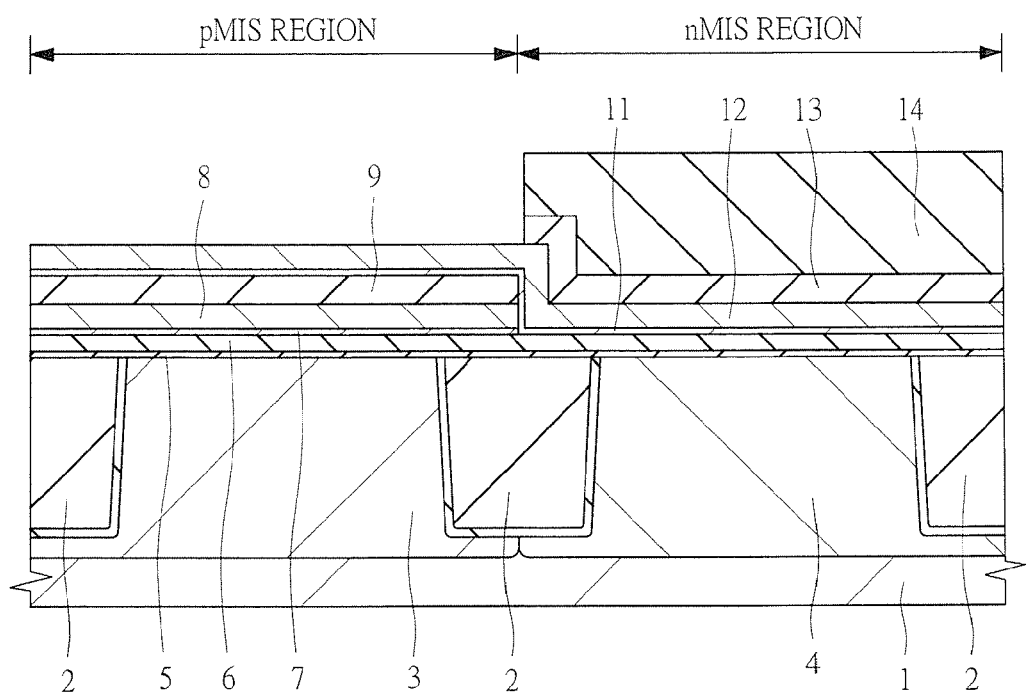
FIG. 12 is a cross-sectional view schematically illustrating main parts of the semiconductor device in the manufacturing process continued from FIG. 11.

Subsequently, as illustrated in FIG. 11, for example, by using a CVD method at a temperature of about 450° C., a silicon nitride film (SiN film) 13 is formed on the TiN film 12 to have a thickness of about 10 nm as a hard mask of the subsequent dry etching process. Next, by using the photolithographic technique, a resist film 14 is formed on the SiN film 13 (see FIG. 12). This resist film 14 is removed in the p-MIS region, and as illustrated in FIG. 12, is used as a mask to cover the SiN film 13 in the n-MIS region. In the manufacturing process illustrated in FIG. 12, as the resist film 14 is provided on the SiN film 13 in its cross-sectional state, so the resist film 14 is also provided in the p-MIS region in its plan view state (see FIG. 2).

Subsequently, as illustrated in FIG. 12, with using the resist film 14 as a mask, the SiN film 13 in the p-MIS region is removed by dry etching, and the SiN film 13 functioning as a hard mask is formed. After that, this resist film 14 is removed, for example, by ashing or the like.

Figure 13:
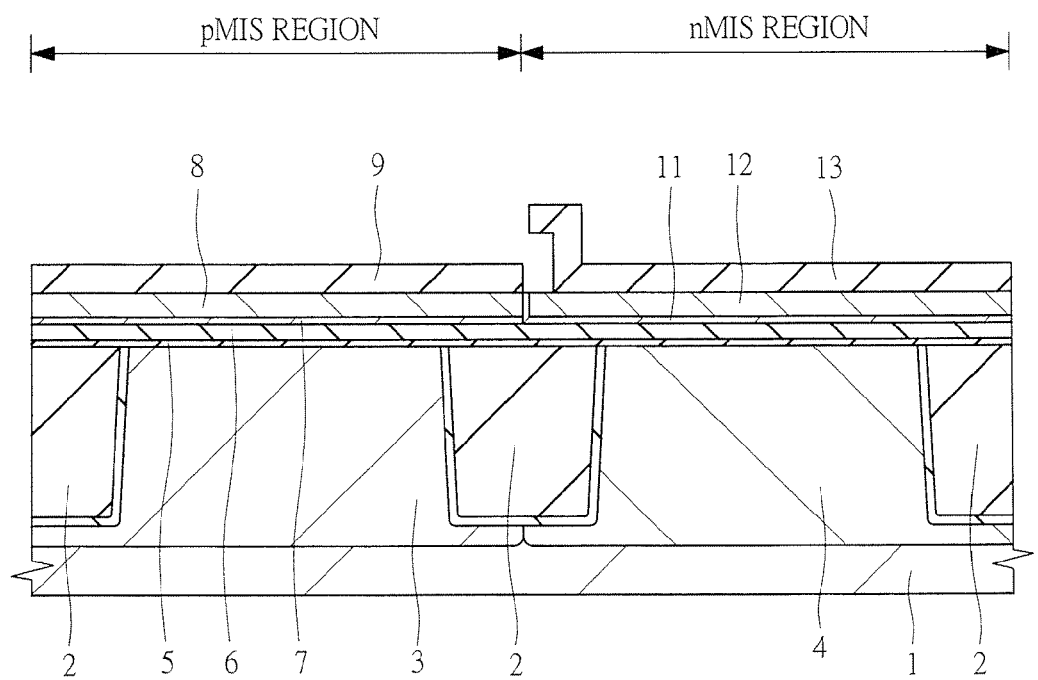
FIG. 13 is a cross-sectional view schematically illustrating main parts of the semiconductor device in the manufacturing process continued from FIG. 12.

Subsequently, as illustrated in FIG. 13, with using the SiN film 13 as a mask, the TiN film 12 of the p-MIS region is removed by the wet etching, for example, by $H_2O_2$ and rinsing. Next, with using the SiN film 13 as a hard mask, the Mg film 11 of the p-MIS region is removed by wet etching, for example, by dHF and rinsing. Thereby, the SiN film 9 of the p-MIS region is exposed. In this manner, the Mg film 11 of the metal thin film is covered by the TiN film 12 of the protective film, and the Mg film 11 is cut and separated together with the TiN film 12, so that the gate electrode material of the n-MIS transistor can be left in the n-MIS region only.

Figure 14:
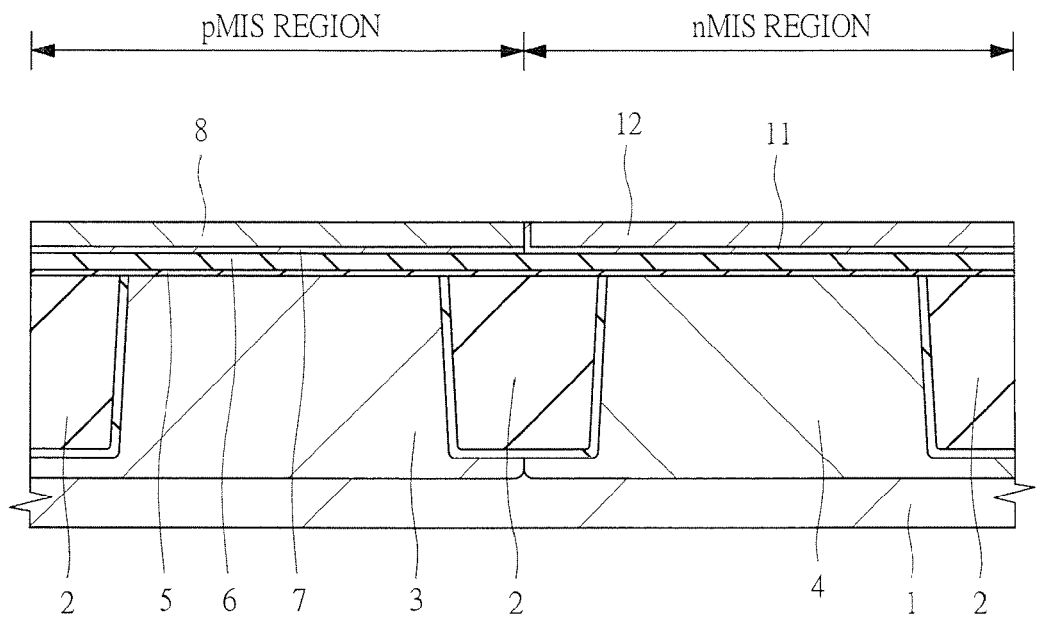
FIG. 14 is a cross-sectional view schematically illustrating main parts of the semiconductor device in the manufacturing process continued from FIG. 13.

Subsequently, the SiN film 9 and the SiN film 13 used as the hard masks are removed by dry etching, and as illustrated in FIG. 14, the TiN film 8 is exposed in the p-MIS region, and the TiN film 12 is exposed in the n-MIS region. By these TiN film 8 and TiN film 12, the surface of the Al film 7 is protected in the p-MIS region, and the surface of the Mg film 11 is protected in the n-MIS region.

Subsequently, in a state in which the TiN film 8 of the protective film is provided in the p-MIS region and the TiN film 12 of the protective film is provided in the n-MIS region, the metal element constituting the Al film 7 (metal thin film) is diffused (or mixed) into the $HfO_2$ film 6 (base insulating film) of the p-MIS region, and further, the metal element constituting the Mg film 11 (metal thin film) is diffused (or mixed) into the $HfO_2$ film 6 (base insulating film) of the n-MIS region.

Figure 15:
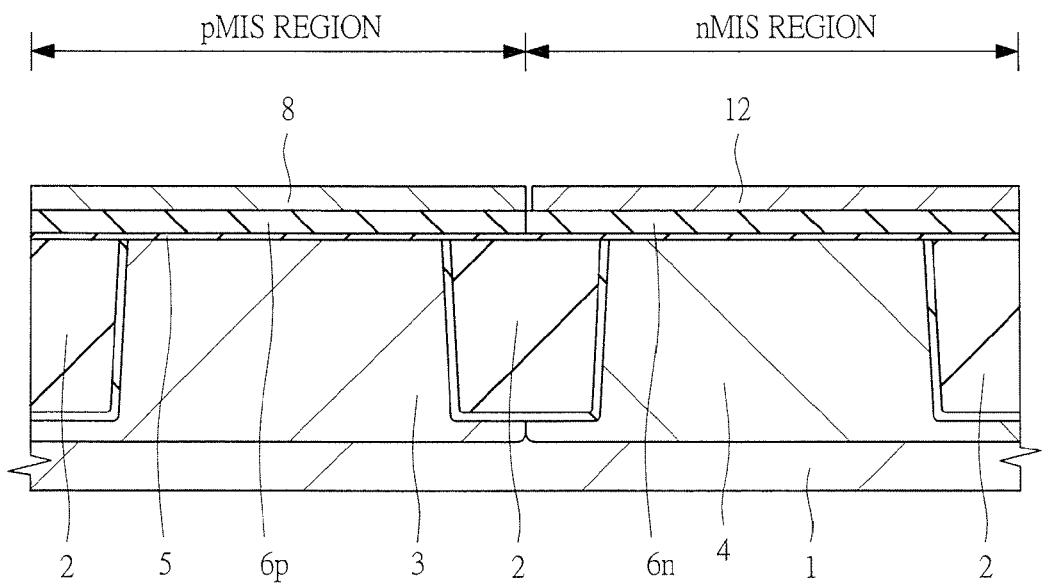
FIG. 15 is a cross-sectional view schematically illustrating main parts of the semiconductor device in the manufacturing process continued from FIG. 14.

Thereby, as illustrated in FIG. 15, the HfAlO film 6p of the high dielectric constant film (admixture), which is higher in dielectric constant than $SiO_2$ (silicon oxide) and containing hafnium (Hf) of the $HfO_2$ film 6 (base insulating film) and oxygen (O) and aluminum (Al) that is the metal element of the Al film 7 (metal thin film), is formed on the $SiO_2$ film 5 in the p-MIS region. This HfAlO film 6p of the high dielectric constant film constitutes the gate insulating film of the p-MIS transistor Qp (see FIG. 3). Further, the HfMgO film 6n of the high dielectric constant film (admixture), which is higher in dielectric constant than $SiO_2$ (silicon oxide) and containing hafnium (Hf) of the $HfO_2$ film 6 (base insulating film) and oxygen (O) and magnesium (Mg) that is the metal element of the Mg film 11 (metal thin film), is formed on the $SiO_2$ film 5 in the n-MIS region. This HfMgO film 6n of the high dielectric constant film constitutes the gate insulating film of the n-MIS transistor Qn (see FIG. 3).

In the present embodiment, to diffuse the metal elements of the metal thin films (Al film 7 and Mg film 11) made of the metal elements only into the base insulating film ($HfO_2$ film 6), the membranous admixture made of the metal element only, that is, the Al film 7 and the Mg film 11 of the metal thin films are laminated on the $HfO_2$ film 6 of the base insulating film, and the substrate 1 is subjected to annealing treatment (thermal treatment), for example, at 600° C. to 1000° C. Thereby, the HfAlO film 6p and the HfMgO film 6n of the high dielectric constant films are formed.

Figure 19:
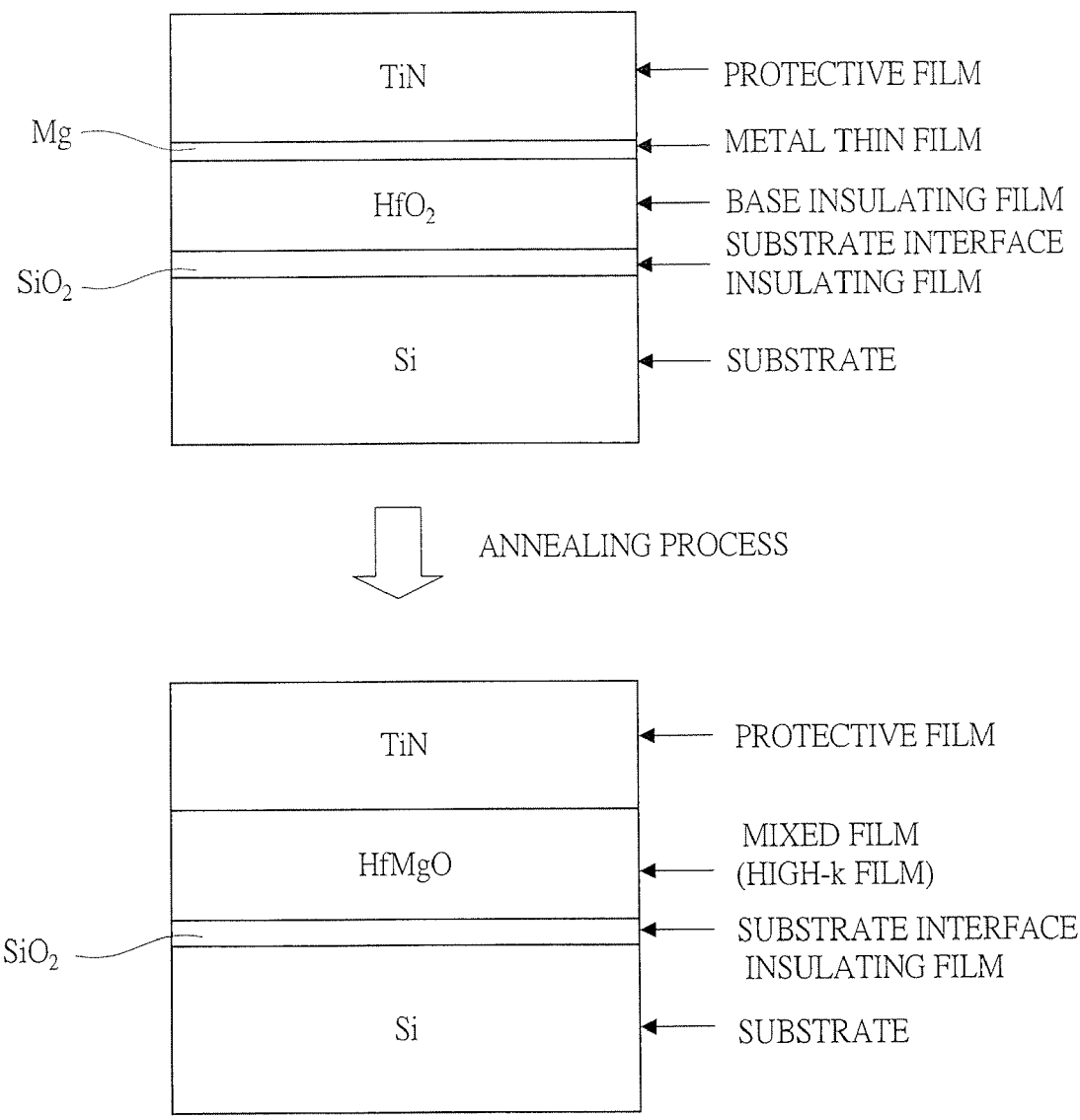
FIG. 19 is a diagram for describing the formation of a high dielectric constant film according to an embodiment of the present invention.

FIG. 19 is a diagram describing the formation of the high dielectric constant film according to the present embodiment, illustrating the case of the n-MIS transistor. In the case of the p-MIS transistor also, the high dielectric constant film can be formed in the same process.

Referring to the structure illustrated in FIG. 19, as described above, first, a silicon oxide ($SiO_2$) film is formed on a main surface of a substrate made of silicon (Si) as a substrate interface insulating film, and a hafnium oxide ($HfO_2$) film is formed on the substrate interface insulating film as a base insulating film. Next, a magnesium (Mg) film is formed as a metal thin film in a vacuum state by the sputtering method, and while maintaining the vacuum state in the same apparatus, that is, in a state not released to the atmosphere, a titanium nitride (TiN) film is formed in lamination as a protective film. After that, by performing an annealing treatment, the constituent element (metal element) of the metal thin film is diffused (or mixed) into the base insulating film, thereby forming a HfMgO film as a high dielectric constant film (admixture). The base insulating film is a membranous base material containing hafnium and oxygen, and the metal thin film is thinner than the base insulating film, and has a thickness of several nm or smaller than or equal to 1 nm, and is a membranous admixture made of the metal element only.

By the way, in the manufacture of the MIS transistor, it is common practice that, from during the manufacturing process, an insulating film including an oxide film is used for the gate insulating film, and a conductive film including a metal film not exerting influence on the gate insulating film is used for the gate electrode. In contrast to this, the metal thin film (Al film 7 and Mg film 11) only made of the metal element in the present embodiment is laminated on the base insulating film ($HfO_2$ film 6) in the midst of the manufacturing process regardless of being supposed to become the constituent element of the gate insulating film (high dielectric constant film) Further, the metal thin film does not constitute the gate electrode in view of the fact that the entire metal thin film becomes the constituent element of the gate insulating film and is not remained.

As described with reference to FIG. 30, by performing the annealing treatment in a state in which the base insulating film 102 (for example, $HfO_2$ film) serving as the base material and another thin metal oxide 103 (for example, the MgO film) serving as the admixture are laminated, the constituent element of the metal oxide film 103 is diffused into the base insulating film, thereby controlling the effective work function of the MIS transistor, that is, the threshold value. However, since two insulting films of the base insulating film 102 and the metal oxide film 103 are laminated, the EOT is thick, and the insulating capacitance becomes smaller than a capacitance value of the single base insulating film. In the miniaturization of the transistor, this factor weakens control characteristics of the gate electric field, and deteriorates the transistor characteristics such as drivability. Specifically, this factor will be explained with reference to FIG. 20.

Figure 20:
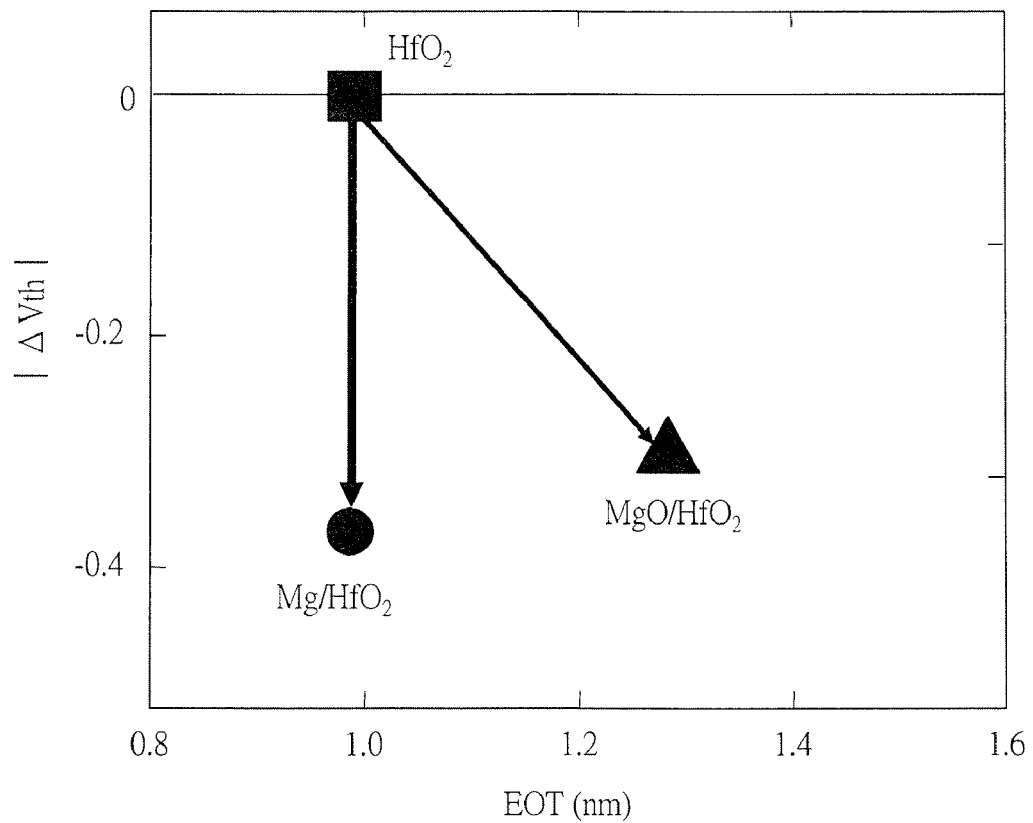
FIG. 20 is a diagram describing a relationship among EOTs of a base insulating film of $HfO_2$ only, a mixed film formed by subjecting a $Mg/HfO_2$ film to annealing treatment, and a mixed film formed by subjecting a $MgO/HfO_2$ film to annealing treatment, and a threshold value of a MIS transistor using these films.

FIG. 20 is a diagram describing a relationship between EOT and threshold value, i.e., the EOTs of the base insulating film of $HfO_2$ only, the mixed film obtained by the annealing treatment of Mg film/$HfO_2$, and the mixed film obtained by the annealing treatment of a MgO film/$HfO_2$, and threshold values ($|\Delta Vth|$) of the MIS transistors using these films. Note that the $HfO_2$ film of the base insulating film is 1.0 nm in EOT, the MgO film of the metal oxide film is 0.05 nm in physical thickness, and the Mg film of the metal thin film is set to 0.5 nm in physical thickness.

As illustrated in FIG. 20, by performing the annealing treatment in a state in which the $HfO_2$ film of the base insulating film serving as the base material and the MgO film of another thin metal oxide film serving as the admixture are laminated, the mixed film (high dielectric constant film) obtained by diffusing the constituent element of the metal oxide film into the base insulating film is used for the gate insulating film, so that the threshold value can be made small. However, since the EOT is increased as compared with the $HfO_2$ film, this is not preferable for the miniaturization of the transistor.

In contrast to this, similarly to the present embodiment, by performing the annealing treatment in a state in which the $HfO_2$ film of the base insulating film serving as the base material and the Mg film of the metal thin film serving as the admixture are laminated, the mixed film (high dielectric constant film) obtained by diffusing the constituent element of the metal thin film into the base insulating film is used for the gate insulating film, so that the threshold value can be made small and the increase of the EOT also can be suppressed as compared with the $HfO_2$ film. In FIG. 20, though the used EOT of the $HfO_2$ film of the base insulating film has been 1.0 nm, also in the case of the $HfO_2$ film having an EOT of 1.5 nm, the two straight lines of the graph show the same tendency as shifting substantially in parallel to the direction in which the EOT becomes larger on the horizontal axis, while the inclination slightly changes.

conventionally, in the case where the gate insulating film including the high dielectric constant film is formed, even if the EOT increases, it has been considered important to reduce the threshold value of the MIS transistor to drive the MIS transistor. Further, since the film is the gate insulating film, it has also been considered that the material constituting the film should be also a film made of an insulating material. In contrast to this, in the present embodiment, by using the metal thin film instead of the insulating material (metal oxide film) for the material constituting the gate insulating film, the desired threshold value is controlled with suppressing the increase of the EOT.

Further, in the present embodiment, the metal thin film on the base insulating film is formed of the metal element only, and therefore, it is in a state easily bonded with oxygen. Hence, it is considered that the metal element of the metal thin film is diffused into the base insulating film so as to be bonded with oxygen of the oxide film constituting the base insulating film by the annealing treatment. Further, by making the metal thin film thinner than the base insulating film, even when the metal thin film made of only the metal element is used for the gate insulating film material, the entire metal element are bonded with oxygen of the base insulating material. Hence, even when the metal thin film is used in the manufacturing process, it never happens that the metal thin film does not function as the gate insulating film after the formation.

Note that, as a method of diffusing the metal element into the base insulating film, it is also considered to laminate the gate electrode material including the metal element sufficiently thick to the base insulating film on the base insulating film, and performing the annealing treatment. In such a method, even after the annealing treatment, the gate electrode material remains. In contrast to this, in the present embodiment, the metal thin film thinner than the base insulating film is laminated on the base insulating film, and the entire metal element of the metal thin film is diffused into the base insulating film, and therefore, no metal thin film remains after the annealing treatment. Further, by adjusting the thickness of the metal thin film, the amount of the metal element diffused into the base insulating film can be controlled, and this is more excellent in controllability than the method in which the metal element contained in the gate electrode material is diffused into the base insulating film.

In this manner, in the present embodiment, while suppressing the increase of the EOT by using the metal thin film instead of the insulating material (metal oxide) for the material constituting the gate insulating film, the desired threshold value is controlled. Consequently, it becomes important not to convert the metal thin film by damages, oxidation, and the like. Hence, in the present embodiment, the conversion by oxidation and the like of the metal thin film is prevented by providing the protective film on the metal thin film. This will be specifically described with reference to FIG. 21.

Figure 21:
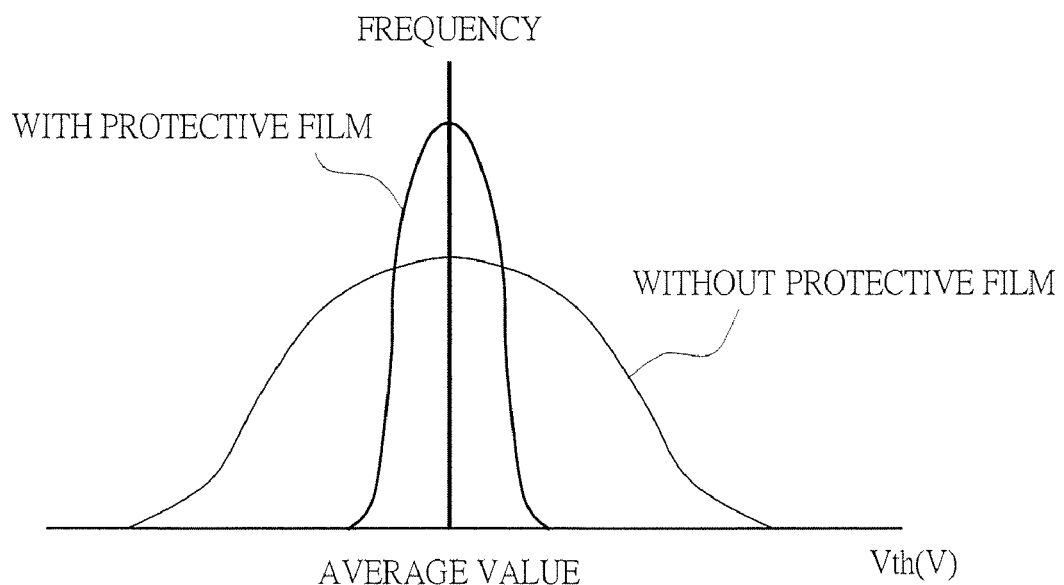
FIG. 21 is a diagram for describing the fluctuation of the threshold value of the MIS transistor due to presence or absence of a protective film.

FIG. 21 is a view describing the fluctuation of the threshold value (Vth (V)) of the MIS transistor by the presence or absence of the protective film.

For example, to diffuse the constituent element of the metal thin film into the base insulating film, the metal thin film is laminated on the base insulating film, and after that, it is considered that a wafer (substrate) is put into a state getting free of vacuum state in order to replace the apparatus once and the like, that is, the wafer (substrate) is released to the atmosphere. Hence, the metal thin film having a thickness of several nm or smaller than or equal to 1 nm is vulnerable to oxidation and conversion of the film by the atmospheric exposure, thereby causing fluctuation of the transistor characteristics.

Thus, in the present embodiment, the annealing treatment is performed to diffuse the metal element of the metal thin film into the base insulating film. At this time, however, it is considered that the wafer (substrate) is moved from the manufacturing device for forming the metal thin film etc. in the mean time to an annealing treatment apparatus. In the case where the substrate is moved in a state in which the protective film is not provided on the metal thin film, the metal thin film is oxidized and converted by the atmospheric exposure containing $O_2$ and $H_2O$. Further, in the case where patterning is performed by using a resist film in a state without protective film on the metal thin film, the surface of the metal thin film is converted by the damages and the like when the resist film is removed. Hence, in the present embodiment, the conversion such as oxidation of the metal thin film is prevented by providing the protective film on the metal thin film. As described with reference to FIG. 30, even in the case in which the metal thin film is laminated on the base insulating film to diffuse the constituent element of the metal oxide film into the base insulating film, and after that, the metal oxide film is once put into a state getting free from the vacuum state to replace the device and the like, providing the protective film on the metal oxide film is effective to prevent the conversion such as oxidation and the like of the metal oxide film.

Further, in the present embodiment, for example, by using the sputtering apparatus, the metal thin film serving as the admixture is formed in a vacuum state and the protective film is formed in a state (in-situ) of keeping the vacuum state maintained. Hence, the modification of the metal thin film by the atmospheric exposure can be suppressed. Further, for example, even in the case where the metal thin film is formed by using the sputtering apparatus and the protective film is formed on the metal thin film and then the substrate is moved to the annealing treatment apparatus, the conversion of the thin metal film due to the atmospheric exposure can be suppressed.

Further, for example, it is considered that, by forming the metal thin film serving as the admixture in the vacuum state and performing the annealing treatment while maintaining the vacuum state using the sputtering apparatus, the metal element of the metal thin film is diffused into the base insulating film, so that the mixed film (high dielectric constant film) can be also formed. In the present embodiment, by further providing the protective film on the metal thin film, the metal element of the metal thin film can be prevented from out-diffusion at the time of the annealing treatment and, the entire constituent element of the metal thin film can be diffused into the base insulting film. Therefore, it is possible to improve the controllability of the threshold value.

Further, in the present embodiment, the titanium nitride (TiN) film is used as the protective film on the metal thin film. A material capable of easily removing the TiN film is known (for example, $H_2O_2$), and this can remove the TiN film without causing damages to the metal thin film of the base.

As illustrated in FIG. 21, the fluctuation of the threshold value of the MIS transistor with the protective film on the metal thin film can be suppressed as compared with the fluctuation of the threshold value of the MIS transistor formed without the protective film on the metal thin film.

In the present embodiment, the base insulating film and the metal thin film are laminated, and the protective film is provided on the metal thin film, and the constituent element of the metal thin film is diffused into the base insulating film, thereby forming the mixed film (high dielectric constant film) constituting the gate insulating film. By forming the MIS transistor using this protective film, damages and conversion of the interface of the mixed film can be suppressed, and further, the out-diffusion of the metal element at the annealing time can be suppressed, and the fluctuation of the threshold value of the MIS transistor can be suppressed. In other words, providing the protective film on the metal thin film can prevent conversion such as oxidation of the metal thin film, and further, enable the metal element of the metal thin film to be stably diffused into the base insulating film.

After performing such an annealing treatment, the TiN film 8 and the TiN film 12 used as the protective films illustrated in FIG. 15 are removed, for example, by the wet etching by $H_2O_2$ and rinsing, and the HfAlO film 6p is exposed in the p-MIS region and the HfMgO film 6n is exposed in the n-MIS region.

Figure 16:
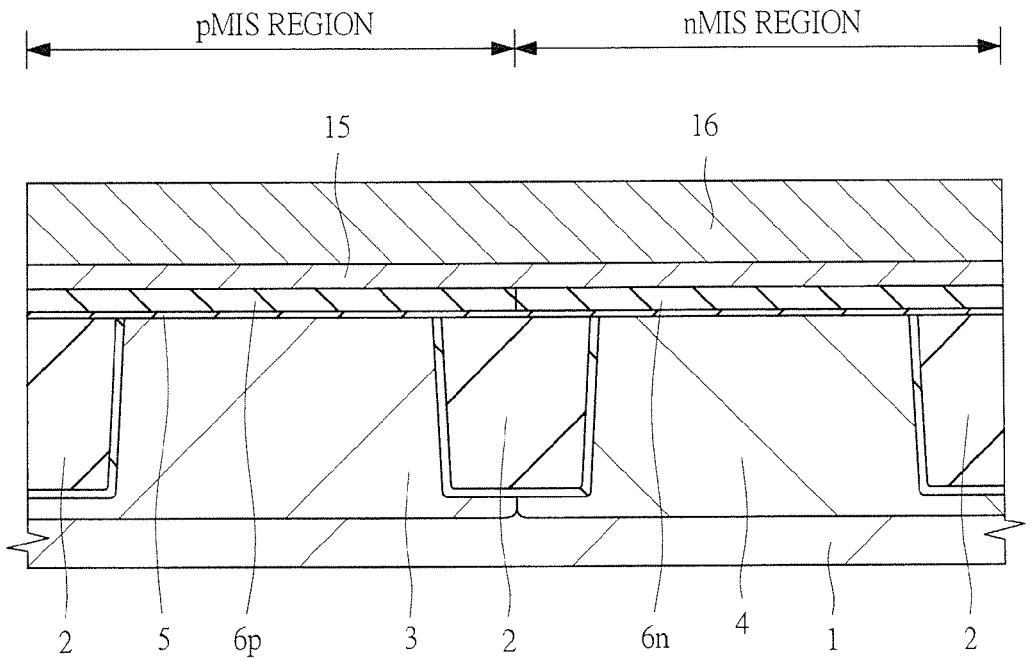
FIG. 16 is a cross-sectional view schematically illustrating main parts of the semiconductor device in the manufacturing process continued from FIG. 15.

Subsequently, as illustrated in FIG. 16, upon forming the gate electrode material, the TiN film 15 and the polysilicon film 16 are formed on the HfAlO film 6p in the p-MIS region and the HfMgO film 6n in the n-MIS region as the conductive films different from the metal films of the Al film 7 and the Mg film 11 formed in the preceding step. In the present embodiment, first, the TiN film 15 having a thickness of about 5 to 20 nm is formed on the HfAlO film 6p and the HfMgO film 6n as the gate electrode material by using the sputtering method, and after that, the conductive polysilicon film 16 having a thickness of about 50 to 100 nm is formed on the TiN film 15. In the present embodiment, though the titanium nitride (TiN) is used as the gate electrode material, it may be tantalum nitride (TaN).

Since the TiN film 8 and the TiN film 12 used as the protective films and the TiN film 15 used as the gate electrode material are made of the same titanium nitride, it is considered that the TiN film 8 and the TiN film 12 are also used as the gate electrode materials without being removed after the annealing treatment. In the present embodiment, in consideration of damages in the steps of the TiN film 8 and the TiN film 12 used as the protective films, the TiN film 15 is again formed as the gate electrode material.

Figure 17:
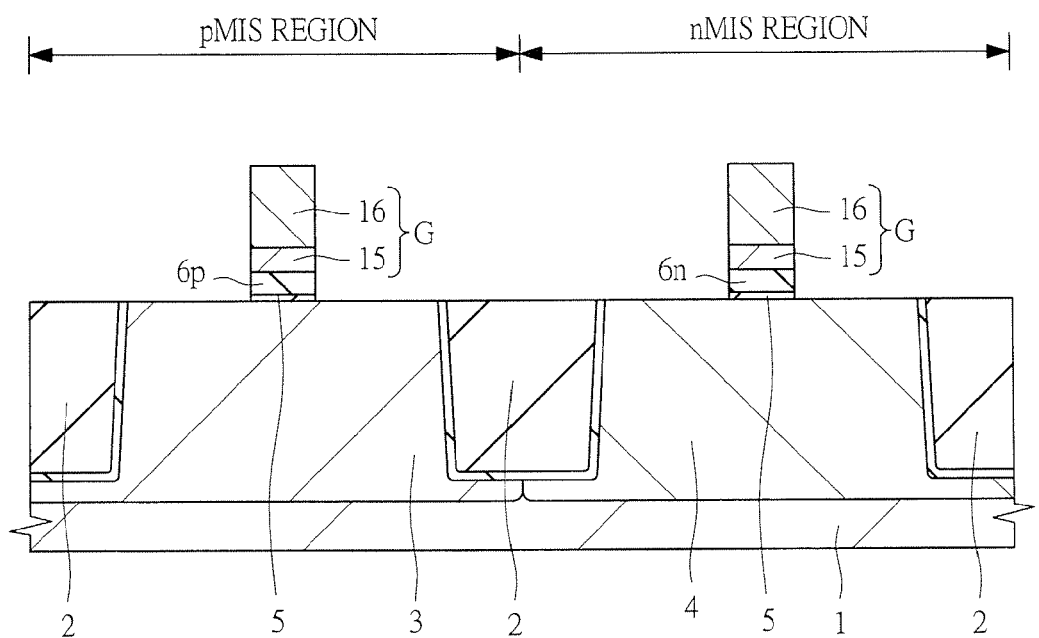
FIG. 17 is a cross-sectional view schematically illustrating main parts of the semiconductor device in the manufacturing process continued from FIG. 16.

Subsequently, as illustrated in FIG. 17, the polysilicon film 16 and the TiN film 15 serving as the conductive films, the HfAlO film 6p and the HfMgO film 6n serving as the mixed films, and the $SiO_2$ film 5 serving as the substrate interface insulating film are patterned to the predetermined shapes, for example, by photolithography technique and etching. Thereby, the gate electrode G of the p-MIS transistor constituted of the polysilicon film 16 and the TiN film 15, and the gate electrode film constituted of the HfAlO film 6p and the $SiO_2$ film 5 are formed in the p-MIS region. Further, the gate electrode G of the n-MIS transistor constituted of the polysilicon film 16 and the TiN film 15, and the gate insulating film constituted of the HfMgO film 6n and the $SiO_2$ film 5 are formed in the n-MIS region. Note that the gate electrode G viewed in the planar view is illustrated in FIG. 2.

Figure 18:
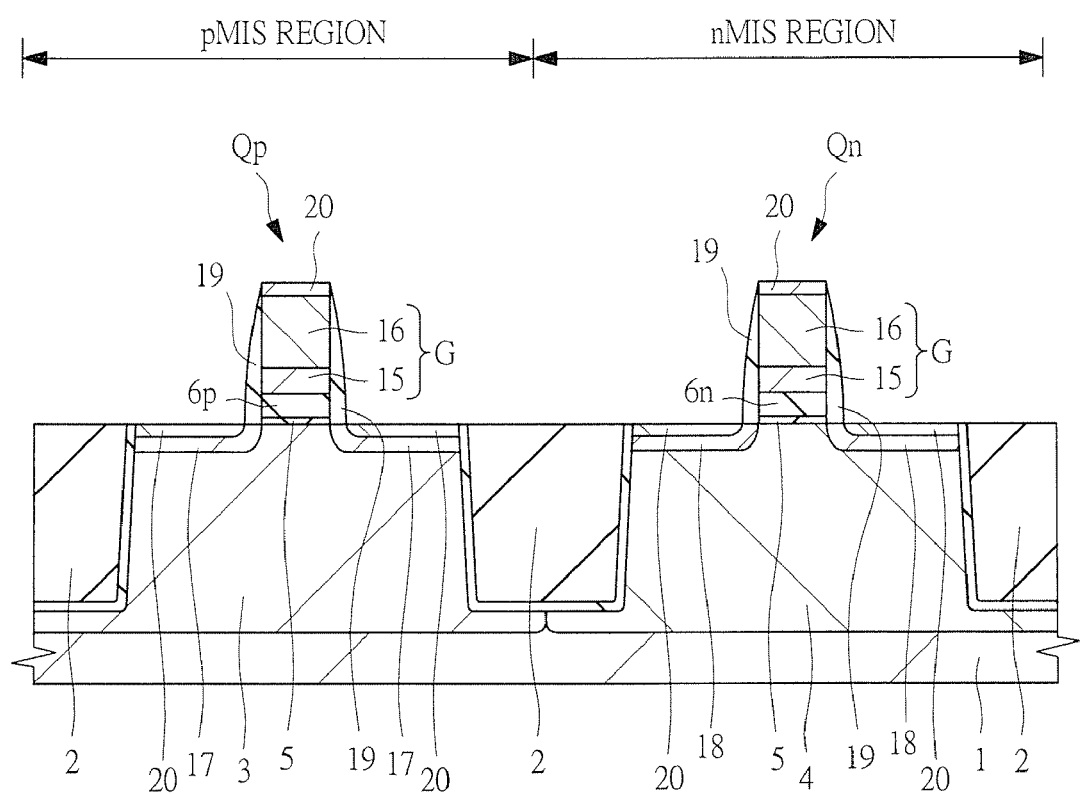
FIG. 18 is a cross-sectional view schematically illustrating main parts of the semiconductor device in the manufacturing process continued from FIG. 17.

Subsequently, as illustrated in FIG. 18, the p-MIS region is formed with the p-type semiconductor regions (source/drain) 17 of the p-MIS transistor Qp, and the n-MIS region is formed with the n-type semiconductor regions (source/drain) 18 of the n-MIS transistor Qn, and after that, the sidewall 19 along the side surface of the gate electrode is formed, and the surfaces of the gate electrode G, the p-type semiconductor regions 17, and the n-type semiconductor regions 18 are formed with the silicide films 20.

By using photolithography technique and ion implantation technique, a p-type impurity, for example, boron or the like is introduced into the substrate 1 in the p-MIS region, and further, an n-type impurity, for example, phosphor, arsenic or the like is introduced into the substrate 1 of the n-MIS region, and after that, by performing an annealing treatment, the p-type semiconductor regions (source/drain) 17 aligned with the gate electrode are formed in the p-MIS region, and the n-type semiconductor regions (source/drain) 18 aligned with the gate electrode are formed in the n-MIS region. Thereby, the p-MIS transistor Qp is formed in the p-MIS region, and the n-MIS transistor Qn is formed in the n-MIS region.

In the present embodiment, the annealing treatment for making the constituent element of the metal thin film to diffuse into the base insulating film and the annealing treatment for forming source/drain are performed in separate processes. It is considered that the annealing treatment for making the constituent element of the metal thin film to diffuse into the base insulating film is not performed in the preceding process, but can be commonly used by that annealing treatment for forming source/drain. In that case, the TiN film used as the gate electrode material has functions such as prevention of the out-diffusion and the like as the protective film.

The depth of the semiconductor regions constituting source/drain is formed at a shallow position as compared with the conventional one according to the miniaturization of the semiconductor device, and therefore, it is necessary to activate the impurities implanted into the substrate 1 at the implanted position. Hence, in the present embodiment, the annealing treatment for forming source/drain is RTA (rapid thermal anneal) such as laser annealing or flash annealing, and is performed at about 1000° C. for several milliseconds. In contrast to this, the annealing treatment for diffusing the constituent element of the metal thin film into the base insulating film is required to diffuse the entire constituent element of the metal thin film into the base insulating film, and therefore, it takes a longer time than RTA. Consequently, in the present embodiment, the annealing treatment for diffusing the constituent element of the metal thin film into the base insulating film and the annealing treatment for forming source/drain are performed in the separate processes.

The formation of the side wall 19 is performed in such a manner that a silicon nitride film is formed on the substrate 1 including the n-MIS region and p-MIS region, for example, by the CVD method, and the silicon nitride film thus formed is subjected to anisotropic etching so as to be formed on the side wall of the pattered gate electrode G.

The formation of the silicide film 20 is performed in such a manner that, for example, a nickel film is formed on the main surface of the substrate 1, and is reacted (silicided) with silicon of the substrate 1 and the polysilicon film 16 constituting the gate electrode by thermal treatment, and after that, unreacted part of the nickel film is removed. Thereby, the silicide films 20 are formed on the gate electrode of the p-MIS transistor Qp and on the p-type semiconductor regions (source/drain) 17 in the p-MIS region, and the silicide films 20 are formed on the gate electrode of the n-MIS transistor Qn and on the n-type semiconductor regions (source/drain) 18 in the n-MIS region. By this silicide film 20, the contact resistance with a contact formed in an upcoming process can be reduced.

Subsequently, as illustrated in FIG. 3, the interlayer insulating film 21 is formed on the main surface of the substrate 1, and after that, a contact hole 22 is formed at a predetermined position (see FIG. 12), and by burying a conductive material into the contact hole, the contact CNT is formed. After that, a wiring 23 electrically connected to the contact CNT is formed. Further, though not illustrated, for example, a multi-layer wiring is formed on the upper layer of the wiring 23, and a passivation film is formed on the uppermost surface, thereby completing the semiconductor device.

To form the interlayer insulating film 12, for example, the silicon oxide film is deposited by the CVD method. Further, the contact holes 22 are formed as to penetrate the interlayer insulating film 21 and reach the gate electrode G, the p-type semiconductor regions (source/drain) 17, and the n-type semiconductor regions (sour/drain) 18 by using photolithographic technique and etching technique.

Further, the formation of the contact CNT is performed in such a manner that, first, a titanium/titanium nitride film is formed on the interlayer insulating film 21 including the bottom surface and the inner wall of the contact hole 22, for example, by the sputtering method, and after that, a tungsten film is formed on the substrate 1 so as to bury the contact hole 22, for example, by the CVD method. Next, unnecessary part of the titanium/titanium nitride film and tungsten film formed on the interlayer insulating film 21 are removed, for example, by the CMP method, thereby forming the contact CNT. The titanium/titanium nitride film of the contact CNT has a barrier property for preventing the tungsten in the tungsten film from diffusing into silicon.

Further, to form the wiring 23, first, a titanium/titanium nitride film, an aluminum film containing copper, and titanium/titanium nitride film on the interlayer insulating film 21 and on the contact CNT are formed in this order. These films can be formed, for example, by using the sputtering method. Next, patterning of these films is performed by using photolithographic technique and etching technique, thereby forming the wiring 23.

By so doing, an integrated circuit including the SRAM can be formed on the substrate 1. That is, in the present embodiment, while the n-MIS transistor Qn of the driving MIS transistor and the p-MIS transistor Qp of the load MIS transistor constituting the SRAM have been illustrated to describe the manufacturing process of the semiconductor device, the other MIS transistors (including the transferring MIS transistor and the like) constituting the SRAM are also formed basically by the same process. In the above-described manner, the semiconductor device according to the present embodiment can be manufactured.

Note that the sequence of the processes of manufacturing the p-MIS transistor Qp and the n-MIS transistor Qn may be reversed to the above sequence of the processes. For example, in the present embodiment, the Al film 7 serving as the gate electrode material of the p-MIS transistor Qp is formed, and after that, the Mg film 11 serving as the gate electrode material of the n-MIS transistor Qn are formed. However, this sequence of the processes may be reversed.

Second Embodiment

Figure 22:
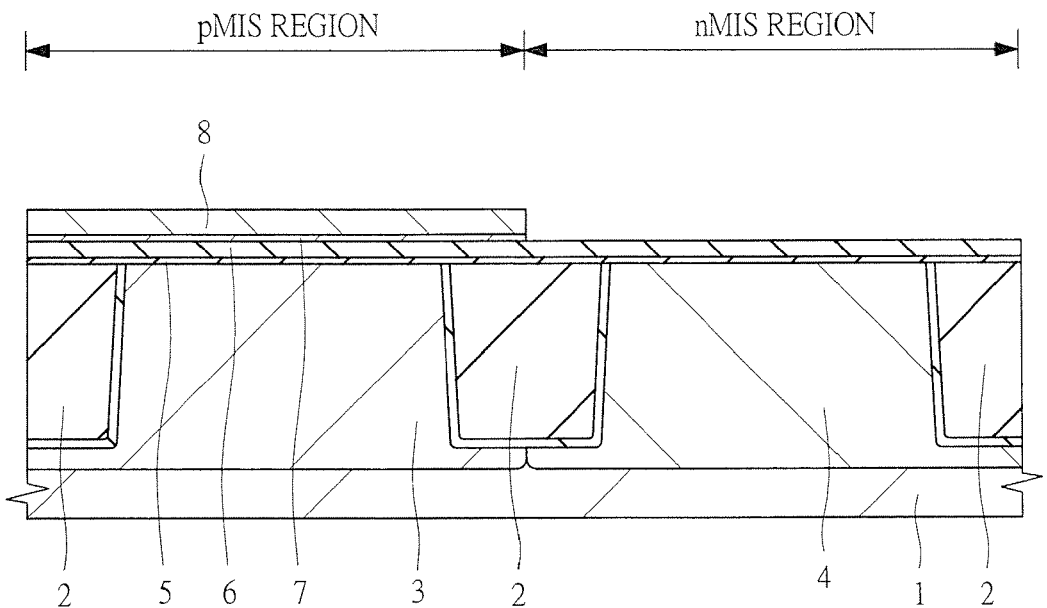
FIG. 22 is a cross-sectional view schematically illustrating main parts of the semiconductor device in a manufacturing process according to another embodiment of the present invention.
Figure 23:
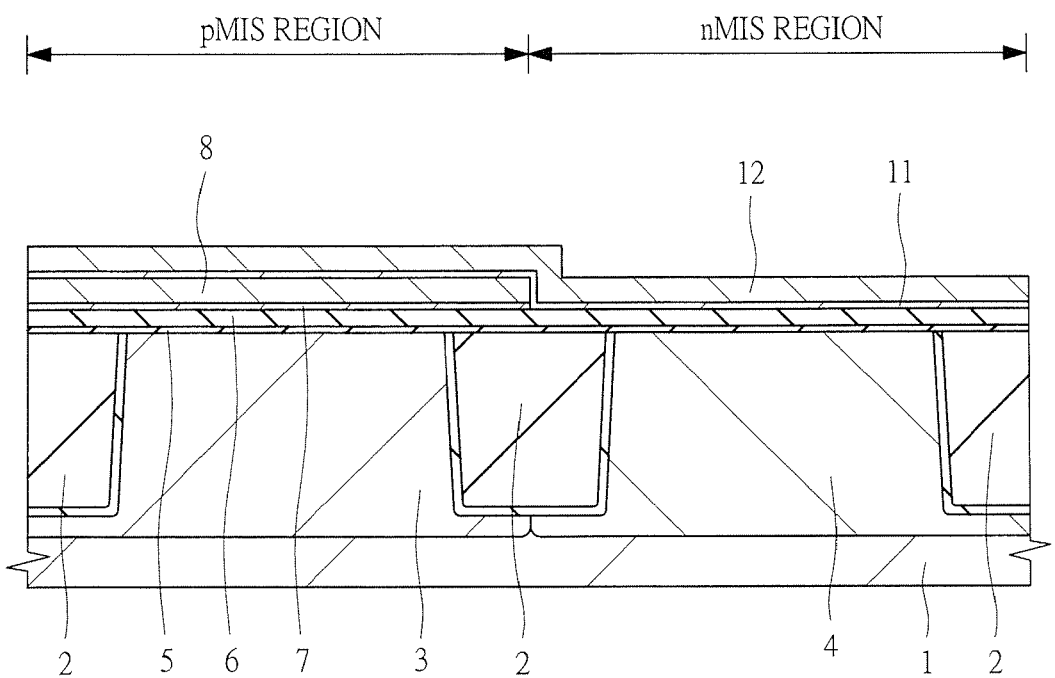
FIG. 23 is a cross-sectional view schematically illustrating main parts of the semiconductor device in the manufacturing process continued from FIG. 22.
Figure 24:
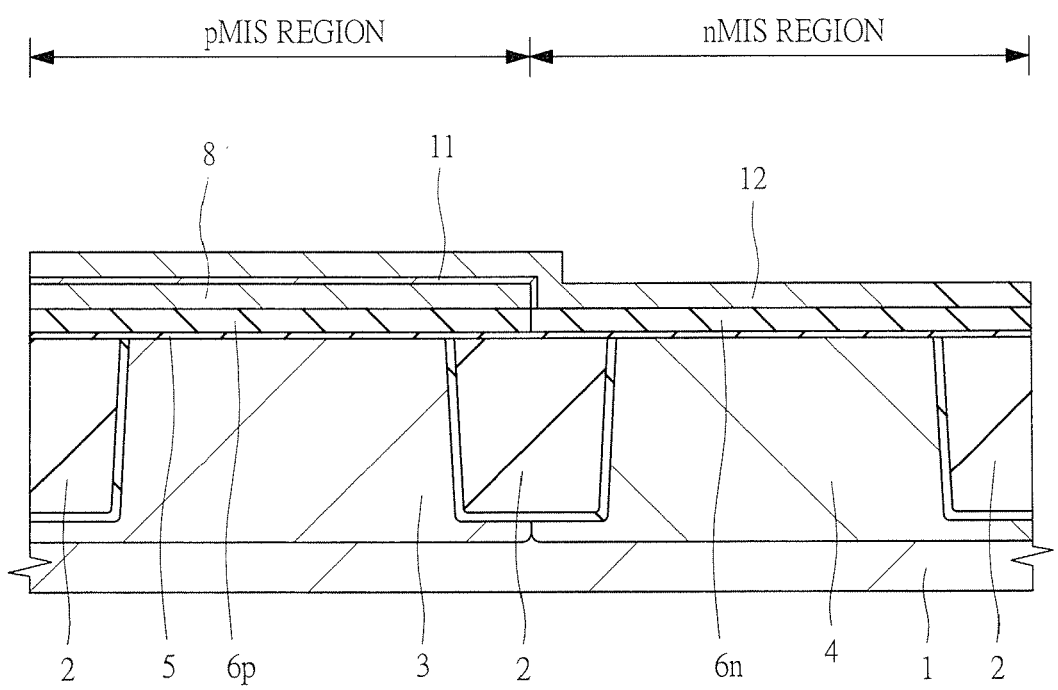
FIG. 24 is a cross-sectional view schematically illustrating main parts of the semiconductor device in the manufacturing process continued from FIG. 23.

In the first embodiment, the case has been described, where mask alignment using the resist films 10 and 14 is carried out twice upon partitioning and separating the metal thin films of the corresponding Al film 7 and Mg film 11 in order to form two kinds of mixed films (high dielectric constant films) of the HfAlO film 6p of the p-MIS transistor Qp and the HfMgO film 6n of the n-MIS transistor Qn. In a second embodiment, a case where one of the mask alignment steps using the resist films is omitted will be described. Although the manufacturing process accompanied with this omission is different from the first embodiment, the final structure is the same as the first embodiment. With placing a central focus on this point different from the first embodiment, the description will be made below. FIGS. 22 to 24 are cross-sectional views schematically illustrating main parts of the semiconductor device in the manufacturing process according to the present embodiment.

As described with reference to FIG. 10, with using the SiN film 9 as a hard mask formed by the photolithographic technique and the etching technique, the TiN film 8, and moreover, the Al film 7 in the n-MIS region are removed. Thereby, the HfO$_2$ film 6 of the n-MIS region is exposed. In this manner, the Al film 7 of the metal thin film is covered by the TiN film 8 of the protective film, and together with the TiN film 8, the Al film 7 is partitioned and separated, so that a gate electrode material of the p-MIS transistor can be left only in the p-MIS region. After that, the SiN film 9 used as the hard mask is removed by dry etching, and as illustrated in FIG. 22, the TiN film 8 is exposed in the p-MIS region.

Subsequently, as illustrated in FIG. 23, a magnesium film (Mg film 11) is formed to have a thickness of about 0.5 nm on the substrate 1, that is, the HfO$_2$ film 6 that is the base material, for example, by using sputtering method. In the present embodiment, the Mg film 11 is formed as a membranous admixture (metal thin film) thinner than the HfO$_2$ film 6 serving as a base material and made of the metal element only. Thereby, the Al film 7 is provided on the HfO$_2$ film 6 of the p-MIS region, and the Mg film 11 made of only the metal element different from the metal element of the p-MIS region is provided on the HfO$_2$ film 6 of the n-MIS region.

Subsequently, as illustrated in FIG. 23, a titanium nitride film (TiN film) 12 having a thickness of about 10 nm is formed on the Mg film 11 serving as admixture. As a film not converting the Mg film 11, that is, as a protective film having humidity resistance and oxidation resistance, and further, the TiN film 12 is used as a protective film in the subsequent process having a resistance to the annealing treatment (thermal treatment) temperature for diffusing the metal element of the Mg film 11 serving as the admixture into the $HfO_2$ film 6 serving as the base material.

Subsequently, in a state in which the TiN film 8 of the protective film is provided in the p-MIS region and the TiN film 12 of the protective film is provided in the n-MIS region, the metal element constituting the Al film 7 (metal thin film) is diffused (or mixed) into the $HfO_2$ film 6 (base insulating film) in the p-MIS region, and the metal element constituting the Mg film 11 (metal thin film) is diffused (or mixed) into the $HfO_2$ film 6 (base insulating film) in the n-MIS region.

Thereby, as illustrated in FIG. 24, the HfAlO film 6p of the high electric constant film (mixed film) higher in dielectric constant than $SiO_2$ (silicon oxide) and containing hafnium (Hf) and oxygen (O) of the $HfO_2$ film 6 (base insulating film) and aluminum (Al) that is the metal element of the Al film 7 (metal thin film) is formed on the $SiO_2$ film 5 in the p-MIS region. The HfAlO film 6p of this high dielectric constant film constitutes the gate insulating film of the p-MIS transistor Qp (see FIG. 3). Further, the HfMgO film 6n of the high dielectric constant film (mixed film) higher in dielectric constant than $SiO_2$ (silicon oxide) and containing hafnium (Hf) and oxygen (O) of the $HfO_2$ film 6 (base insulating film) and magnesium (Mg) that is the metal element of the Mg film 11 (metal thin film) is formed on the $SiO_2$ film 5 in the n-MIS region. The HfMgO film 6n of this high dielectric constant film constitutes the gate insulating film of the n-MIS transistor Qn (see FIG. 3).

After performing such an annealing treatment, the TiN film 8 and the TiN film 12 used as the protective films illustrated in FIG. 24 are removed by wet etching, for example, by $H_2O_2$ and rinsing, so that the HfAlO film 6p is exposed in the p-MIS region, and the HfMgO film 6n is exposed in the n-MIS region. After that, the process advances to the process as described with reference to FIG. 16, and eventually, the semiconductor device as illustrated in FIG. 3 is completed.

In the present embodiment, by providing the mask according to the photolithographic technique, a first metal thin film (Al film 7) is formed on the base insulating film ($HfO_2$ film 6) in the p-MIS region, and a second metal thin film (Mg film 11) is formed on the base insulating film (for example, $HfO_2$ film 6) in the n-MIS region, and after that, the annealing treatment is performed without providing the mask according to the photographic technique, and the respective constituent elements of the metal thin films are diffused into the base insulating film.

In this manner, to form the two kinds of high dielectric constant films (HfAlO film 6p and HfMgO film 6n), two mask alignments by the partitioning and separating of the metal thin film in the first embodiment is reduced to one mask alignment in the second embodiment, thereby simplifying the process, and moreover, depending on a degree of the superposition (whether overlapping or separating) of the interfacial portions of the two masks, the trouble of adjusting the removal condition due to the alternation of easiness of the film removal is saved, so that the manufacturing cost can be reduced.

Third Embodiment

Figure 25:
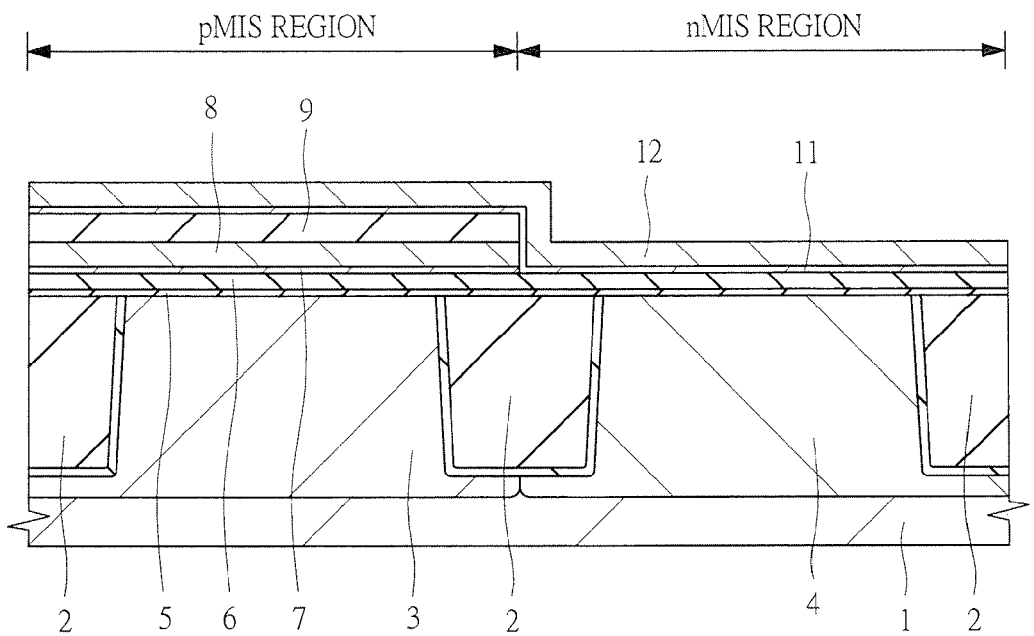
FIG. 25 is a cross-sectional view schematically illustrating main parts of the semiconductor device in a manufacturing process according to still another embodiment of the present invention.
Figure 26:
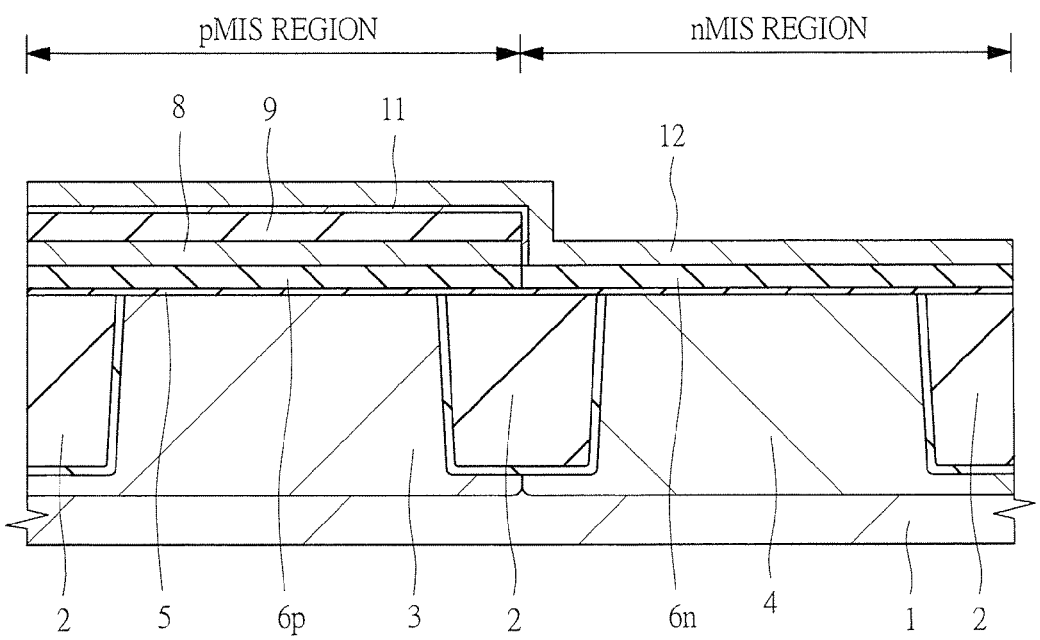
FIG. 26 is a cross-sectional view schematically illustrating main parts of the semiconductor device in the manufacturing process continued from FIG. 25.

In the second embodiment described above, the description has been made on the case where the SiN film 9 used as a hard mask is removed, and the TiN film 8 of the protective film is exposed in the p-MIS region, and after that, the Mg film 11 of the metal thin film and the TiN film 12 of the protective film are formed in the n-MIS region. In a third embodiment, a description will be made on the case where the subsequent process is performed without removing the SiN film 9 used as a hard mask. Although the manufacturing process accompanied with that is different from the second embodiment, the final structure is the same as the second embodiment. With placing a central focus on the difference from the second embodiment, a description will be made below. FIGS. 25 to 26 are cross-sectional views schematically illustrating main parts of a semiconductor device in the manufacturing process in the present embodiment.

As described with reference to FIG. 10, with using the SiN film 9 formed by photolithographic technique and etching technique as a hard mask, the TiN film 8 and further the Al film 7 in the n-MIS region are removed. Thereby, the $HfO_2$ film 6 of the n-MIS region is exposed. In this manner, by covering the Al film 7 of the metal thin film with the TiN film 8 of the protective film and partitioning and separating the Al film 7 together with the TiN film 8, the gate electrode material of the p-MIS transistor can be left in the p-MIS region only.

Subsequently, as illustrated in FIG. 25, for example, by using a sputtering method, a magnesium film (Mg film 11) is formed to have a thickness of about 0.5 nm on the substrate 1, that is, the $HfO_2$ film 6 serving as a base material. In the present embodiment, the Mg film 11 is formed as a membranous admixture (metal thin film) thinner than the $HfO_2$ film 6 serving as the base material and made of the metal element only. Thereby, the Al film 7 is provided on the $HfO_2$ film 6 in the p-MIS region, and the Mg film 11 made of only the metal element different from the metal element in the p-MIS region is provided on the $HfO_2$ film 6 in the n-MIS region.

Subsequently, as illustrated in FIG. 25, titanium nitride film (TiN film) 12 having a thickness of about 10 nm is formed on the Mg film 11 serving as the admixture. As a film not converting the Mg film 11, that is, as a protective film having humidity resistance and oxidation resistance, and further, as a protective film having resistance to an annealing treatment (thermal treatment) temperature for diffusing the metal element of the Mg film 11 serving as the admixture into the $HfO_2$ film 6 serving as the base material in the subsequent process, the TiN film 12 is used.

Subsequently, in a state in which the TiN film 8 of the protective film is provided in the p-MIS region and the TiN film 12 of the protective film is provided in the n-MIS region, the metal element constituting the Al film 7 (metal thin film) is diffused (or mixed) into the $HfO_2$ film 6 (base insulating film) in the p-MIS region, and further, the metal element constituting the Mg film 11 (metal thin film) is diffused (or mixed) into the $HfO_2$ film 6 (base insulating film) in the n-MIS region.

Thereby, as illustrated in FIG. 26, the HfAlO film 6p of the high dielectric film (mixed film) higher in dielectric constant than $SiO_2$ (silicon oxide) and including hafnium (Hf) of the $HfO_2$ film 6 (base insulating film), oxygen (O), and aluminum (Al) that is the metal element of the Al film 7 (metal thin film) is formed on the $SiO_2$ film 5 in the p-MIS region. The HfAlO film 6p of this high dielectric constant film constitutes the gate insulating film of the p-MIS transistor Qp (see FIG. 3). Further, the HfMgO film 6n of the high dielectric film (mixed film) higher in dielectric constant than $SiO_2$ (Silicon oxide) and including hafnium (Hf) of $HfO_2$ film 6 (base insulating film), oxygen (O), and magnesium (Mg) that is the metal element of the Mg film 11 (metal thin film) is formed on the $SiO_2$ film 5 in the n-MIS region. The HfMgO film 6n of this high dielectric constant film constitutes the gate insulating film of the n-MIS transistor Qn (see FIG. 3).

After performing the annealing treatment in this manner, the TiN film 8 and the TiN film 12 used as the protective films illustrated in FIG. 26 are removed by the wet etching, for example, by $H_2O_2$ and rinsing, and the HfAlO film 6p is exposed in the p-MIS region, and the HfMgO film 6n is exposed in the n-MIS region. At this time, the TiN film 11/the SiN film 9/the TiN film 8 can be removed in the p-MIS region by the lift-off method. In the second embodiment, as described with reference to FIG. 10, upon removing the SiN film 9, though damage is given sometimes to the surface of the HfMgO film 6n of the n-MIS region, similarly to the present embodiment, upon removing the TiN film 12 of the n-MIS region, the TiN film 11/the SiN film 9/the TiN film 8 of the p-MIS region are removed, and thus the damage to the surface of the HfMgO film 6n can be suppressed.

Here, the reason of using the TiN film 8 and the TiN film 12 as metal protective films is that wet treatment (chemical treatment) material which can easily remove titanium nitride is known (for example, $H_2O_2$), and titanium nitride is removed without giving damage to the HfAlO film 6p and the HfMgO film 6n serving as bases.

After that, the process advances to the process described with reference to FIG. 16, and eventually, the semiconductor device as illustrated in FIG. 3 is completed.

Fourth Embodiment

Figure 27:
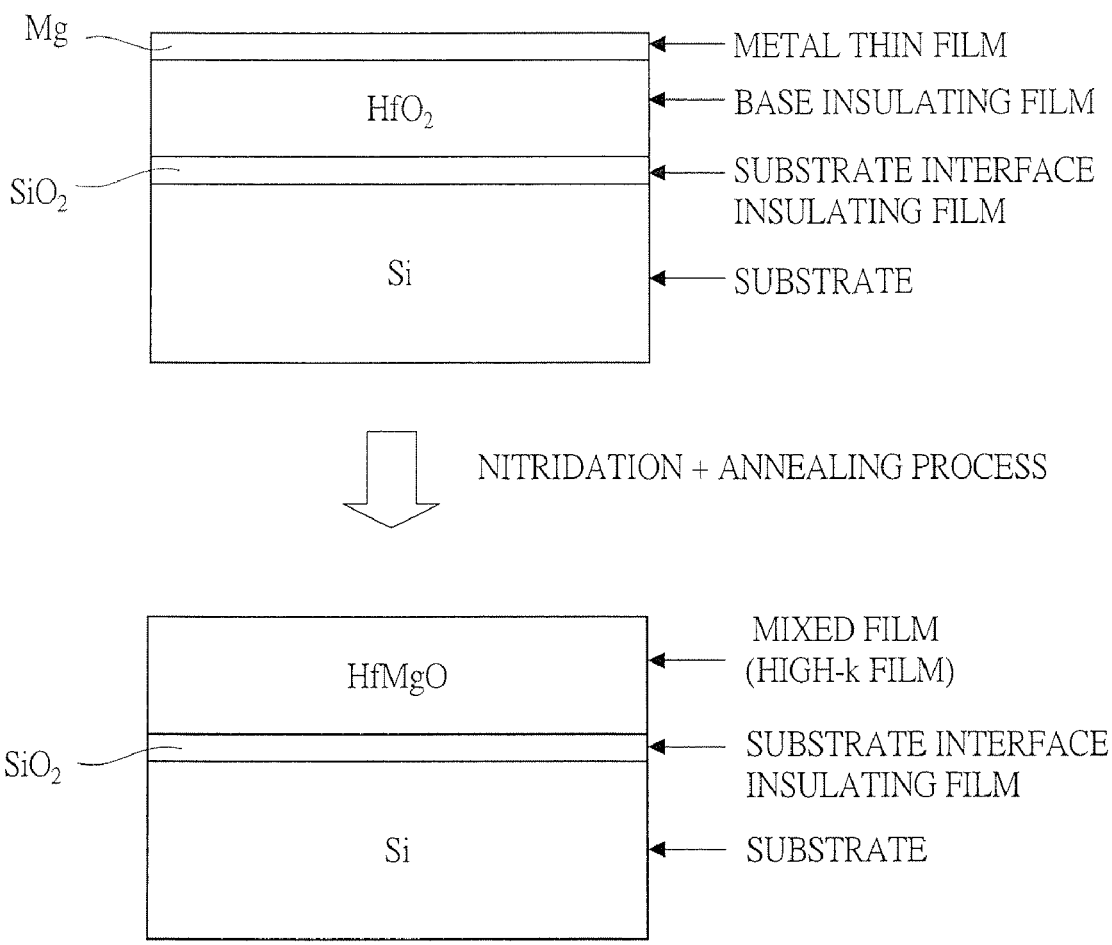
FIG. 27 is a diagram for describing the formation of a high dielectric constant film in the still another embodiment of the present invention.

In the first embodiment, with reference to, for example, FIG. 19, the description has been made on the case where the protective film (for example, TiN film) is provided on the metal thin film (for example, Mg film) to suppress conversion of the metal thin film by the atmospheric exposure. In a fourth embodiment, a case of diffusing the metal element of the thin metal film into the base insulating film without providing the protective film will be described. FIG. 27 is a diagram describing formation of a high dielectric constant film in the present embodiment, and illustrating the case of an n-MIS transistor. Incidentally, the description will be made with placing a central focus on the difference from the first embodiment, but a description on a p-MIS transistor will be omitted as it can be formed by the same process as the n-MIS transistor.

The structure illustrated in FIG. 27 is such that, first, a silicon oxide ($SiO_2$) is formed on the main surface of a substrate made of silicon (Si) as a substrate interface insulating film, and a hafnium oxide ($HfO_2$) film is formed on the substrate interface insulating film as a base insulating film. Next, a magnesium (Mg) film is formed as a metal thin film in a vacuum state by a sputtering method. Next, the surface of the metal thin film is nitrided, and after that, the constituent element (metal element) of the metal thin film is diffused into the base insulating film by performing annealing treatment (thermal treatment) in a nitride atmosphere (may be in a plasma state), thereby forming a HfMgO film as the high dielectric constant film (admixture). The base insulating film is a membranous base material including hafnium and oxygen, and the metal thin film is thinner than the base insulating film, and has a thickness of several nm or smaller than or equal to 1 nm, and moreover, it is a membranous admixture made of the metal element only.

By nitriding the surface of the metal thin film in this manner, it is possible to suppress conversion of the metal thin film. Incidentally, it is also considered that, after forming the metal thin film, the surface of the metal thin film is oxidized, and is further nitrided, and after that, the constituent element (metal element) of the metal thin film is diffused into the base insulating film by the annealing treatment so as to form the HfMgO film as the high dielectric constant film (mixed film). This is considered effective in the case where, though the surface of the metal thin film is oxidized, minute amount of oxygen is diffused into the base insulating film to make them react more with the metal element of the metal thin film. Even in such a case also, since the metal thin film is nitrided after being oxidized, its conversion can be suppressed.

Fifth Embodiment

Figure 28:
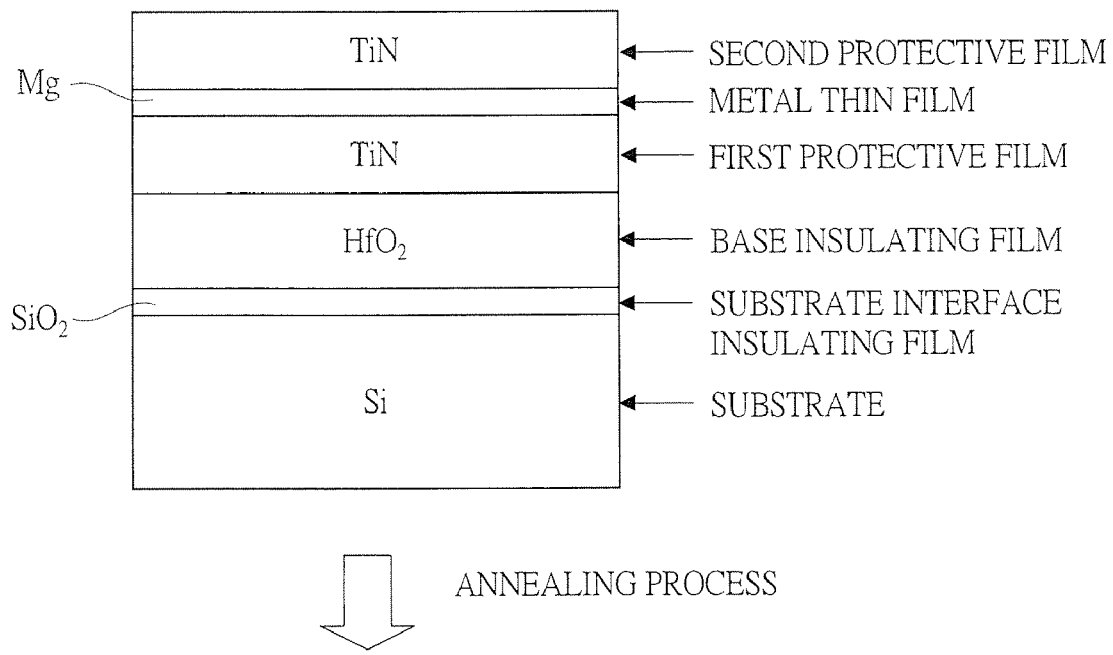
FIG. 28 is a diagram for describing the formation of a high dielectric constant film in the still another embodiment of the present invention.
Figure 28:
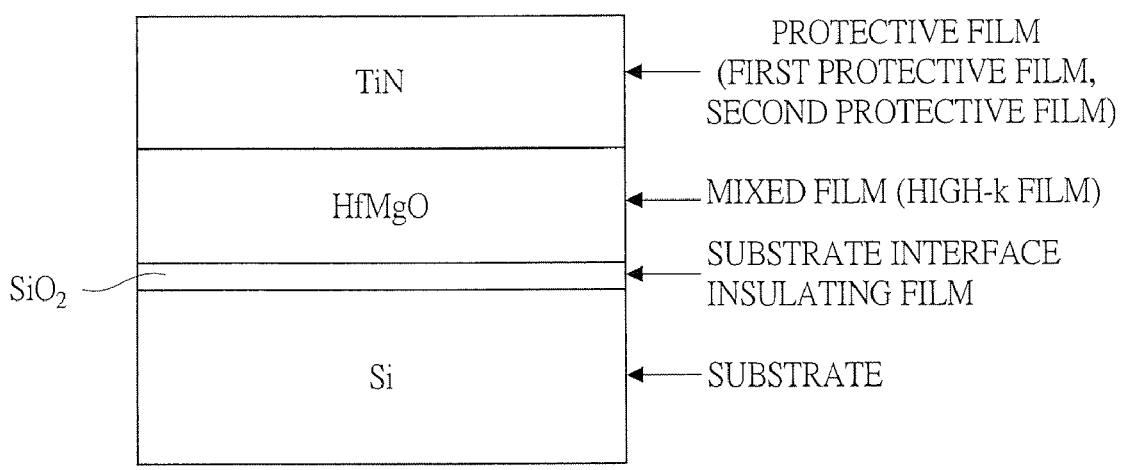

In the first embodiment, with reference to, for example, FIG. 19, the description has been made on the case where the protective film (for example, TiN film) is provided only on the metal thin film (for example, Mg film) to suppress conversion of the metal thin film by the atmospheric exposure and the like. In a fifth embodiment, a description will be made on a case where the metal thin film is protected by being sandwiched by protective films. FIG. 28 is a diagram describing formation of a high dielectric constant film in the present embodiment, and shows the case of an n-MIS transistor. Incidentally, the description will be made with placing a central focus on the difference from the first embodiment, but a description of a p-MIS transistor will be omitted as it can be formed in the same process as the n-MIS transistor.

The structure illustrated in FIG. 28 is made such that, first, a silicon oxide ($SiO_2$) film is formed on a main surface of a substrate made of silicon (Si) as a substrate interface insulating film, and a hafnium oxide ($HfO_2$) film is formed on the substrate interface insulating film as a base insulating film. Next, a first protective film (TiN film) is formed on the base insulating film, for example, by a sputtering method, and a magnesium (Mg) film as a metal thin film, and further, a second protective film (TiN film) are formed by a sputtering method while keeping the vacuum state. After that, by diffusing (or mixing) the constituent element (metal element) of the metal thin film into the base insulating film by performing annealing treatment, a HfMgO film is formed as a mixed film (high dielectric constant film). The base insulating film is a membranous base material including hafnium and oxygen, and the metal thin film is a membranous admixture thinner than the base insulating film and having a thickness of several nm or smaller than or equal to 1 nm, and moreover, being made of the metal element only.

In this manner, the metal thin film may be sandwiched by the first protective film and the second protective film, and by subjecting this laminated layer to the annealing treatment, the metal element of the metal thin film can be easily diffused into the base insulating film.

Sixth Embodiment

In the first embodiment, with referred to, for example, FIG. 19, the description has been made on the case where the protective film (for example, TiN film) is provided on the metal thin film (for example, Mg film) to suppress the conversion of the metal thin film by the atmospheric exposure. In a sixth embodiment, a description will be made on a case where a protective film (for example, TiN film) is provided on a base insulating film (for example, $HfO_2$ film), and a metal thin film (for example, Mg film) is provided between a substrate interface insulating film ($SiO_2$ film) and a base insulating film ($HfO_2$ film). FIG. 29 is a diagram describing the formation of a high dielectric constant film in the present embodiment, and shows the case of an n-MIS transistor. Incidentally, the description will be made with placing a central focus on the difference from the first embodiment, but description of a p-MIS transistor will be omitted as it can be formed in the same process as the n-MIS transistor.

The structure illustrated in FIG. 29 is such that, first, a silicon oxide ($SiO_2$) film is formed on the main surface of a substrate made of silicon (Si) as a substrate interface insulating film, and a magnesium (Mg) film is formed on the substrate interface insulating film as a metal thin film, for example, by using a sputtering method. Next, a base insulating film ($HfO_2$ film) is formed on the metal thin film, and a protective film (TiN film) is formed on the base insulating film, for example, by using the sputtering method. After that, by diffusing (or mixing) the constituent element (metal element) of the metal thin film into the base insulating film by performing annealing treatment, a HfMgO film is formed as a mixed film (high dielectric constant film). The base insulating film is a membranous base material including hafnium and oxygen, and the metal thin film is thinner than the base insulating film and having a thickness of several nm or smaller than or equal to 1 nm, and moreover, is a membranous admixture made of the metal element only. Further, in the case where a $HfO_2$ film of the base insulating film is formed also by using the sputtering method, the metal thin film, the base insulating film, and the protective film can be sequentially formed while maintaining a vacuum state.

In this manner, by performing the annealing treatment by providing the metal thin film on the substrate interface insulating film, a dipole can be generated in the mixed film in the vicinity of the substrate interface insulating film, and the controllability of effective work function can be improved.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the above-described embodiment, while a description has been made on the case where the metal single material such as magnesium and aluminum is used as the admixture, to constitute the gate insulating film of a n-MIS transistor, it is possible to use the laminated film of constituent elements of metal oxides both having smaller electronegativity than hafnium oxide such as magnesium/tantalum, or magnesium/other rare earth metals, or, constituent elements of metal oxides both having larger electronegativity than hafnium oxide such as aluminum/tantalum. Further, by using a laminated film combining a constituent element of a metal oxide having larger electronegativity than hafnium oxide and a constituent element of a metal oxide having smaller electronegativity than hafnium oxide, such as magnesium/aluminum, it is considered that a fine adjustment of the threshold value can be also achieved.

Further, for example, though the description has been made on the case of using the CMIS to the semiconductor device composed of a single-crystal Si to form a CMIS in the above-described embodiment, it can be also used to a single-crystal Ge substrate, a compound semiconductor substrate such as GaAs, or SiC, and an SOI (Silicon On Insulator) substrate.

Further, for example, though the manufacturing technique of the SRAM has been targeted in the above described embodiment, the embodiment is not limited to this, but can be also applied, for example, to the manufacturing technique of the CMIS constituting a logic circuit.

The present invention is widely used in the manufacture industry of semiconductor devices, particularly, a semiconductor device including a CMIS.

What is claimed is:

1. A method of manufacturing a semiconductor device comprising a MIS transistor, the method comprising the steps of:
   (a) forming a silicon oxide film on a main surface of a semiconductor substrate;
   (b) forming a membranous base material containing hafnium and oxygen on the silicon oxide film;
   (c) forming a membranous admixture thinner than the base material and made of only a metal element on the base material;
   (d) forming a protective film on the admixture;
   (e) diffusing the admixture into the base material in a state of having the protective film, thereby forming a mixed film having a higher dielectric constant than silicon oxide and containing hafnium and oxygen of the base material and the metal element of the admixture on the silicon oxide film;
   (f) removing the protective film after the step (e);
   (g) forming a conductive film on the mixed film; and
   (h) forming a gate electrode made of the conductive film, and a gate insulating film formed of the mixed film and the silicon oxide film.

2. The method of manufacturing a semiconductor device according to claim 1, wherein
   the MIS transistor is n-channel type, and,
   in the step (c), the admixture made of a metal element constituting a metal oxide having a smaller electronegativity than hafnium oxide is formed.

3. The method of manufacturing a semiconductor device according to claim 1, wherein
   the MIS transistor is p-channel type, and,
   in the step (c), the admixture made of a metal element constituting a metal oxide having a larger electronegativity than hafnium oxide is formed.

4. The method of manufacturing a semiconductor device according to claim 1, wherein the admixture is diffused into the base material by an annealing treatment in the step (e).

5. The method of manufacturing a semiconductor device according to claim 1, wherein
   the admixture is formed in a vacuum state in the step (c), and
   the protective film is formed in the step (d) while keeping the vacuum state.

6. The method of manufacturing a semiconductor device according to claim 1, wherein a titanium nitride film is formed as the protective film in the step (d).

* * * * *